US010867235B2

(12) United States Patent
Finn

(10) Patent No.: US 10,867,235 B2
(45) Date of Patent: Dec. 15, 2020

(54) METALLIZED SMARTCARD CONSTRUCTIONS AND METHODS

(71) Applicant: David Finn, Tourmakeady County Mayo (IE)

(72) Inventor: David Finn, Tourmakeady County Mayo (IE)

(73) Assignee: Féinics AmaTech Teoranta, Lower Churchfield Tourmakeady (IE)

( * ) Notice: Subject to any disclaimer, the term of this patent is extended or adjusted under 35 U.S.C. 154(b) by 89 days.

(21) Appl. No.: 16/247,612

(22) Filed: Jan. 15, 2019

(65) Prior Publication Data

US 2019/0171923 A1    Jun. 6, 2019

Related U.S. Application Data

(63) Continuation-in-part of application No. 15/969,816, filed on May 3, 2018, now Pat. No. 10,518,518, (Continued)

(51) Int. Cl.
*G06K 19/06* (2006.01)
*G06K 19/077* (2006.01)
(Continued)

(52) U.S. Cl.
CPC ....... *G06K 19/07794* (2013.01); *G06K 19/02* (2013.01); *G06K 19/07722* (2013.01);
(Continued)

(58) Field of Classification Search
CPC ............. G06K 19/02; G06K 19/07722; G06K 19/07769; G06K 19/07783; H01Q 1/2216;
(Continued)

(56) References Cited

U.S. PATENT DOCUMENTS 5,084,699 A    1/1992  DeMichele
5,955,723 A    9/1999  Reiner
(Continued)

FOREIGN PATENT DOCUMENTS

EP    1031939    8/2000
EP    1158601    11/2001
(Continued)

OTHER PUBLICATIONS

International Search Report and Written Opinion from PCT/EP2013/051175 (dated Apr. 2, 2013).
(Continued)

*Primary Examiner* — Karl D Frech
(74) *Attorney, Agent, or Firm* — Gerald E. Linden

(57) ABSTRACT

A dual-interface smartcard (SC) having a booster antenna (BA) with coupler coil (CC) in its card body, and a metallized face plate having a window opening for an antenna module (AM) having contact pads (CP) and a module antenna (MA). A compensation loop (CL) may be disposed directly behind a peripheral portion of the booster antenna. The compensation loop may be formed of a conductive material, such as copper, or of ferrite, and may have two free ends or no free ends. Additionally, the window opening may be substantially larger than the antenna module, the face plate may be perforated, ferrite material may be disposed between the face plate and the booster antenna, the coupler coil may be offset from the antenna, and a ferrite element may be disposed in the antenna module between the module antenna and the contact pads.

16 Claims, 12 Drawing Sheets

Related U.S. Application Data which is a continuation-in-part of application No. 15/939,281, filed on Mar. 29, 2018, which is a continuation-in-part of application No. 15/358,138, filed on Nov. 22, 2016, now Pat. No. 9,960,476, which is a continuation-in-part of application No. 15/072,356, filed on Mar. 17, 2016, now Pat. No. 9,836,684, which is a continuation-in-part of application No. 14/551,376, filed on Nov. 24, 2014, now Pat. No. 9,390,364, which is a continuation-in-part of application No. 14/492,113, filed on Sep. 22, 2014, now Pat. No. 9,798,968, which is a continuation-in-part of application No. 14/465,815, filed on Aug. 21, 2014, now Pat. No. 9,475,086, and a continuation-in-part of application No. 14/173,815, filed on Feb. 6, 2014, now Pat. No. 9,195,932, which is a continuation of application No. 14/020,884, filed on Sep. 8, 2013, now Pat. No. 9,033,250, said application No. 14/492,113 is a continuation-in-part of application No. 13/744,686, filed on Jan. 18, 2013, now abandoned, which is a continuation-in-part of application No. 13/600,140, filed on Aug. 30, 2012, now Pat. No. 8,991,712, said application No. 14/465,815 is a continuation-in-part of application No. 13/744,686, filed on Jan. 18, 2013, now abandoned, which is a continuation-in-part of application No. 13/730,811, filed on Dec. 28, 2012, now Pat. No. 9,165,240, which is a continuation-in-part of application No. 13/310,718, filed on Dec. 3, 2011, now Pat. No. 8,366,009, said application No. 13/744,686 is a continuation-in-part of application No. 13/600,140, filed on Aug. 30, 2012, now Pat. No. 8,991,712, and a continuation-in-part of application No. 13/205,600, filed on Aug. 8, 2011, now Pat. No. 8,474,726.

(60) Provisional application No. 61/737,746, filed on Dec. 15, 2012, provisional application No. 61/732,414, filed on Dec. 3, 2012, provisional application No. 61/697,825, filed on Sep. 7, 2012, provisional application No. 61/693,262, filed on Aug. 25, 2012, provisional application No. 61/619,951, filed on Apr. 4, 2012, provisional application No. 61/589,434, filed on Jan. 23, 2012, provisional application No. 61/624,384, filed on Apr. 15, 2012, provisional application No. 61/586,781, filed on Jan. 14, 2012.

(51) Int. Cl.

| | |
|---|---|
| *H01Q 1/22* | (2006.01) |
| *H05K 1/16* | (2006.01) |
| *H01Q 7/00* | (2006.01) |
| *H01Q 21/29* | (2006.01) |
| *G06K 19/02* | (2006.01) |
| *H01F 38/14* | (2006.01) |
| *H05K 3/10* | (2006.01) |

(52) U.S. Cl.
CPC . *G06K 19/07769* (2013.01); *G06K 19/07783* (2013.01); *H01Q 1/2216* (2013.01); *H01Q 1/2225* (2013.01); *H01Q 1/2283* (2013.01); *H01Q 7/00* (2013.01); *H01Q 21/29* (2013.01); *H05K 1/165* (2013.01); *H01F 38/14* (2013.01); *H05K 3/103* (2013.01); *H05K 2201/10098* (2013.01); *Y10T 29/49018* (2015.01); *Y10T 29/49162* (2015.01)

(58) Field of Classification Search
CPC ...... H01Q 1/2225; H01Q 1/2283; H01Q 7/00; H01Q 21/29; H05K 1/165
USPC .................................................. 235/492, 487
See application file for complete search history.

(56) References Cited

U.S. PATENT DOCUMENTS

| | | |
|---|---|---|
| 5,982,624 A | 11/1999 | Onoda et al. |
| 6,233,818 B1 | 5/2001 | Finn et al. |
| 6,329,958 B1 | 12/2001 | McLean et al. |
| 6,378,774 B1 | 4/2002 | Emori et al. |
| 6,698,089 B2 | 3/2004 | Finn et al. |
| 6,817,085 B2 | 11/2004 | Uchikoba et al. |
| 7,928,918 B2 | 4/2011 | Caruana et al. |
| 7,948,057 B2 | 5/2011 | Furukawa et al. |
| 7,980,477 B2 | 7/2011 | Finn |
| 8,100,337 B2 | 1/2012 | Artigue et al. |
| 8,130,166 B2 | 3/2012 | Ayala et al. |
| 8,158,018 B2 | 4/2012 | Nakahata et al. |
| 8,261,997 B2 | 9/2012 | Gebhart |
| 8,991,712 B2* | 3/2015 | Finn ................. G06K 19/07794 235/492 |
| 9,033,250 B2 | 5/2015 | Finn et al. |
| 2002/0121685 A1* | 9/2002 | Higuchi ........... G06K 19/07783 257/679 |
| 2003/0057288 A1 | 3/2003 | Salzgeber |
| 2009/0152362 A1 | 6/2009 | Ayala |
| 2009/0169776 A1 | 7/2009 | Herslow |
| 2009/0315320 A1 | 12/2009 | Finn |
| 2010/0176205 A1 | 7/2010 | Patrice |
| 2011/0023289 A1 | 2/2011 | Finn |
| 2011/0189620 A1 | 8/2011 | Herslow |
| 2012/0038445 A1 | 2/2012 | Finn |
| 2012/0055013 A1 | 3/2012 | Finn |
| 2012/0074233 A1 | 3/2012 | Finn et al. |
| 2013/0075477 A1 | 3/2013 | Finn et al. |
| 2013/0126622 A1 | 5/2013 | Finn |
| 2013/0146670 A1 | 6/2013 | Grieshofer et al. |
| 2013/0146671 A1 | 6/2013 | Grieshofer et al. |
| 2014/0152511 A1 | 6/2014 | Merlin et al. |

FOREIGN PATENT DOCUMENTS

| | | |
|---|---|---|
| EP | 1854222 | 8/2006 |
| EP | 2063489 | 2/2008 |
| EP | 2541472 | 1/2013 |

OTHER PUBLICATIONS

A Study of Making Ferrimagnetic Sheet Materials for RFID Applications, Jen-Yung Hsu, Shin-Kang Kuo and Yung-Hsiung Hung, China Steel Corporation.

* cited by examiner

Dual Interface (DI) Smart Card, and Readers

Booster Antenna BA with Coupler Coil CC different areas of the Card Body (CB)

inclusion of an antenna extension AE

Stackup of a Metallized Card

Compensating Loop (CL), with gap

Compensating Loop (CL), no gap contact pads (CP)

contact pad layout / asignments extending the edges of some of the contact pads (CP)

trimming the edges of some of the contact pads (CP)

increasing the gap between some of the contact pads (CP)

modifying the gap between some of the contact pads (CP)

perforating the contact pads (CP)

thinning the contact pads (CP)

Etched or Wound MA

Perforated CPs perforations in a logo pattern perforations in a logo pattern two module antenna segments (MA1, MA2)

two antenna segments (OS, IS) connected as quasi-dipole

METALLIZED SMARTCARD CONSTRUCTIONS AND METHODS

CROSS-REFERENCE TO RELATED APPLICATIONS

This application claims filing date benefit (priority), as a nonprovisional or continuation-in-part from the following US provisional and nonprovisional patent applications, all of which are incorporated by reference herein:

This is a continuation-in-part of Ser. No. 15/969,816 filed 3 May 2018
  Ser. No. 15/969,816 is a continuation-in-part of Ser. No. 15/939,281 filed 29 Mar. 2018
    Ser. No. 15/939,281 is a continuation-in-part of Ser. No. 15/358,138 filed 22 Nov. 2016
      Ser. No. 15/358,138 is a continuation-in-part of Ser. No. 15/072,356 filed 17 Mar. 2016
      Ser. No. 15/072,356 is a continuation-in-part of Ser. No. 14/551,376 filed 24 Nov. 2014
      Ser. No. 15/072,356 is a continuation-in-part of Ser. No. 14/492,113 filed 22 Sep. 2014
        Ser. No. 14/492,113 is a continuation-in-part of Ser. No. 14/465,815 filed 21 Aug. 2014
        Ser. No. 14/492,113 is a continuation-in-part of Ser. No. 14/173,815 filed 6 Feb. 2014
          Ser. No. 14/173,815 a continuation of Ser. No. 14/020,884 filed 8 Sep. 2013
        Ser. No. 14/492,113 is a continuation-in-part of Ser. No. 13/744,686 filed 18 Jan. 2013
          Ser. No. 13/744,686 is a nonprovisional of 61/737,746 filed 15 Dec. 2012
          Ser. No. 13/744,686 is a nonprovisional of 61/732,414 filed 3 Dec. 2012
          Ser. No. 13/744,686 is a nonprovisional of 61/697,825 filed 7 Sep. 2012
          Ser. No. 13/744,686 is a nonprovisional of 61/693,262 filed 25 Aug. 2012
          Ser. No. 13/744,686 is a nonprovisional of 61/619,951 filed 4 Apr. 2012
          Ser. No. 13/744,686 is a nonprovisional of 61/589,434 filed 23 Jan. 2012
      Ser. No. 15/072,356 is a continuation-in-part of Ser. No. 14/465,815 filed 21 Aug. 2014
        Ser. No. 14/465,815 is a continuation-in-part of Ser. No. 14/173,815 filed 6 Feb. 2014
          Ser. No. 14/173,815 a continuation of Ser. No. 14/020,884 filed 8 Sep. 2013
            Ser. No. 14/020,884 is a continuation-in-part of Ser. No. 13/600,140 filed 30 Aug. 2012
        Ser. No. 14/465,815 is a continuation-in-part of Ser. No. 13/744,686 filed 18 Jan. 2013
          Ser. No. 13/744,686 is a continuation-in-part of Ser. No. 13/730,811 filed 28 Dec. 2012
            Ser. No. 13/730,811 is a continuation-in-part of Ser. No. 13/310,718 filed 3 Dec. 2011
          Ser. No. 13/744,686 is a continuation-in-part of Ser. No. 13/600,140 filed 30 Aug. 2012
            Ser. No. 13/600,140 is a nonprovisional of 61/624,384 filed 15 Apr. 2012
            Ser. No. 13/600,140 is a nonprovisional of 61/586,781 filed 14 Jan. 2012
          Ser. No. 13/744,686 is a continuation-in-part of Ser. No. 13/205,600 filed 8 Aug. 2011

The specification of this application may be similar to: Ser. No. 13/744,686 filed 18 Jan. 2013

TECHNICAL FIELD

The invention (in some aspects) relates to "secure documents" such as electronic passports, electronic ID cards and smart cards (data carriers) having RFID (radio frequency identification) chips or chip modules (CM) and operating in a contactless mode (ISO 14443) including dual interface (DI, or DIF) cards which can also operate in contact mode (ISO 7816-2), and more particularly to improving coupling between components within the smart card, such as between a module antenna (MA) connected with the RFID chip (CM) and a booster antenna (BA) in the card body (CB) of the smart card and inductively coupled with the module antenna (MA) and consequent improvements in the RFID chip (CM) interacting with external RFID readers.

The invention (in some aspects) relates to passive RFID smart cards having a conductive metal or metallized layer which shields the electromagnetic field generated by a reader. In particular, dual interface cards which operate on the principle of reactive coupling.

BACKGROUND

For purposes of this discussion, an RFID transponder generally comprises a substrate, an RFID chip (or chip module) disposed on or in the substrate, and an antenna disposed on or in the substrate. The transponder may form the basis of a secure document such as an electronic passport, smart card or national ID card.

The chip module may operate solely in a contactless mode (such as ISO 14443), or may be a dual interface (DIF) module which can operate also in contact mode (such as ISO 7816-2) and a contactless mode. The chip module may harvest energy from an RF signal supplied by an external RFID reader device with which it communicates.

The substrate, which may be referred to as an "inlay substrate" (for electronic passport) or "card body" (for smart card) may comprise one or more layers of material such as Polyvinyl Chloride (PVC), Polycarbonate (PC), polyethylene (PE), PET (doped PE), PET-G (derivative of PE), Teslin™, Paper or Cotton/Noil, and the like. When "inlay substrate" is referred to herein, it should be taken to include "card body", and vice versa, unless explicitly otherwise stated.

The chip module may be a leadframe-type chip module or an epoxy-glass type chip module. The epoxy-glass module can be metallized on one side (contact side) or on both sides with through-hole plating to facilitate the interconnection with the antenna. When "chip module" is referred to herein, it should be taken to include "chip", and vice versa, unless explicitly otherwise stated.

The antenna may be a self-bonding (or self-adhering) wire. A conventional method of mounting an antenna wire to a substrate is to use a sonotrode (ultrasonic) tool which vibrates, feeds the wire out of a capillary, and embeds it into or sticks it onto the surface of the substrate. A typical pattern for an antenna is generally rectangular, in the form of a flat (planar) coil (spiral) having a number of turns. The two ends of the antenna wire may be connected, such as by thermocompression (TC) bonding, to terminals (or terminal areas, or contact pads) of the chip module. See, for example U.S. Pat. Nos. 6,698,089 and 6,233,818, incorporated by reference herein.

A problem with any arrangement which incorporates the antenna into the chip module (antenna module) is that the overall antenna area is quite small (such as approximately 15 mm×15 mm), in contrast with a more conventional antenna which may be formed by embedding several (such as 4 or 5) turns of wire around a periphery of the of the inlay substrate or card body of the secure document, in which case the overall antenna area may be approximately 80 mm×50 mm (approximately 20 times larger). When an antenna is incorporated with the chip module, the resulting entity may be referred to as an "antenna module".

SOME PRIOR ART

U.S. Pat. No. 8,261,997 (NXP) discloses a carrier assembly for receiving an RFID transponder chip has an attachment side for being attached to a consumer device and an operation side for receiving an RF signal in operational use of the RFID transponder chip.

. . . there is provided an electrically conductive shielding layer at the attachment side. The effect of this layer is that it effectively shields the transponder from the material of the surface on which the transponder is to be provided. The shielding layer has some detuning effect on the resonance frequency, but once this detuning effect has been taken into account in the antenna design, there is hardly any further detuning effect due to the surface on which the RFID transponder is provided, i.e. the RFID transponder comprising the carrier assembly of the invention is suitable for virtually any surface.

. . . the magnetic layer comprises a ferrite foil or a ferrite plate.

. . . the electrically conductive shielding layer comprises a material selected from a group comprising: copper, aluminum, silver, gold, platinum, conductive paste, and silver ink.

(Claim 1) A carrier assembly for receiving an RFID transponder chip, the carrier assembly having an attachment side for being attached to a consumer device and having an operation side for receiving an RF signal in operational use of the RFID transponder chip, wherein: the carrier assembly comprises a layer stack that includes an antenna layer, a magnetic layer, and an electrically conductive shielding layer; the antenna layer is arranged between the operation side and the magnetic layer; the electrically conductive shielding layer is arranged between the magnetic layer and the attachment side; the antenna layer comprises an antenna having contacts for being coupled to the RFID transponder chip; and an outer contour of a first projection of the antenna in a direction perpendicular to the antenna layer fully encloses an outer contour of a second projection of the electrically conductive shielding layer in the direction perpendicular to the antenna layer.

EP1854222 A2 (NXP) discloses A mobile communication device (1, 10) comprises shielding components that provide electromagnetic shielding or attenuation between a first area (A) and a second area (B, B1, B2) within and/or external of the communication device (1, 10). In said first area (A) an antenna (4) and at least one ferrite (6) are arranged, which ferrite (6) is provided to interact with said antenna (4) and to guide a magnetic flux between said first area (A) and said second area (B, B1, B2).

[0001] a mobile communication device comprising shielding components, which cause electromagnetic shielding or attenuation between a first area and a second area within and/or external of the communication device.

[0008] A mobile communication device comprising shielding components, which cause electromagnetic shielding or attenuation between a first area and a second area within and/or external of the communication device, wherein in said first area an antenna and at least one ferrite are arranged, which ferrite is provided to interact with said antenna and to guide a magnetic flux between said first area and said second area.

[0019] The first device portion 1a contains a carrier 3, such as a printed circuit board. The FIGS. 1-2 also show a first area A and a second area, the latter consisting of an internal second area B1 and an external second area B2. The first area A and the internal second area B1 within first device portion 1a are separated from each other by the carrier 3. On the surface of this carrier 3, facing said first area A, an antenna 4 and a reader 5 are located. The antenna 4 is assumed to be a metallic layer on carrier 3 and is thus not visible in the side views of FIGS. 1 and 2. The reader 5 sends and receives electromagnetic signals via the antenna 4. For instance, the reader 5 may be configured as a near-field communication device or as an RFID device for communicating with wireless RF transponders. Second device portion 1b shields electromagnetic fields, either due to electromagnetically shielding materials used for structural elements of said second device portion 1b, or due to electromagnetically shielding means and elements incorporated in said second device portion 1b, such as a display with metallic layers, a PCB with grounding layers, batteries, electronic components or the like.

. . . although this is not shown in the FIGS. 3-4—the mobile communication device 10 may also comprise an internal second area B1 and an external second area B2 as shown FIGS. 1-2 in the case where the first device portion 10a comprises shielding components (i.e. the carrier 3).

(Claim 1) 1. A mobile communication device (1, 10) comprising shielding components, which cause electromagnetic shielding or attenuation between a first area (A) and a second area (B, B1, B2) within and/or external of the communication device (1, 10), wherein in said first area (A) an antenna (4) and at least one ferrite (6) are arranged, which ferrite (6) is provided to interact with said antenna (4) and provided to guide a magnetic flux between said first area (A) and said second area (B, B1, B2).

US 20120055013 (Finn; 2012: "S32") discloses microstructures such as connection areas, contact pads, antennas, coils, plates for capacitors and the like may be formed using nanostructures such as nanoparticles, nanowires and nanotubes. A laser may be used to assist in the process of microstructure formation, and may also be used to form other features on a substrate such as recesses or channels for receiving the microstructures. A smart mobile phone sticker (MPS) mounted to a cell phone with a self-sticking shielding element comprising a core layer having ferrite particles.

EP 02063489 A1 (Tyco) discloses an antenna element and method for manufacturing same There is provided a more easily manufactured antenna device used in a tag composing an RFID (Radio Frequency Identification) system. The antenna device (10) has (A) a laminar magnetic element formed of a magnetic composition containing a magnetic material and a polymer material, and (B) antenna wiring provided on one of the surfaces of the laminar magnetic element.

[0002] RFID systems have been beginning to be used in various fields and their convenience has been demonstrated. As a result, it is expected that the RFID systems maybe utilized in many other fields to take advantage of their convenience. On the other hand, various problems have been pointed out with respect to the technology related to the RFID systems and solutions therefore are desirable from now on.

[0003] One of such problems is a problem as to the antenna which tags, readers/writers or the like as units for forming the RFID systems include. The antenna is used in signal transmission and/or power supply by utilizing the electromagnetic induction effect.

[0004] Such an antenna is known to be greatly influenced by the environment in which it is placed. In particular, if a metallic article is present close to the antenna, an eddy current caused by the magnetic flux generated by the antenna flows on the metal surface in the reader/writer. As a result, carrier waves are significantly attenuated, and with respect to the tag, the intensity of the magnetic flux flowing through the antenna is attenuated, which may make communication impossible.

[0005] In order to suppress the effect generated by such a metallic article, combining a member formed of a magnetic material with the antenna has been proposed. For example, a non-contact type IC card reader/writer provided with a magnetic material in the form of a flexible sheet under the antenna has been proposed in order to prevent the adverse effects to the communication caused by the metallic article as well as to reduce occupied space (see Patent Reference 1 below). In this reader/writer, the antenna and the magnetic material in the form of the sheet are bonded with double sided adhesive tape.

Foil Composite Card

US 2009/0169776 (2009; Herslow) discloses composite cards which include a security layer comprising a hologram or diffraction grating formed at, or in, the center, or core layer, of the card. The hologram may be formed by embossing a designated area of the core layer with a diffraction pattern and depositing a thin layer of metal on the embossed layer. Additional layers may be selectively and symmetrically attached to the top and bottom surfaces of the core layer. A laser may be used to remove selected portions of the metal formed on the embossed layer, at selected stages of forming the card, to impart a selected pattern or information to the holographic region. The cards may be "lasered" when the cards being processed are attached to, and part of, a large sheet of material, whereby the "lasering" of all the cards on the sheet can be done at the same time and relatively inexpensively. Alternatively, each card may be individually "lasered" to produce desired alpha numeric information, bar codes information or a graphic image, after the sheets are die-cut into cards.

claim 18. A method for forming a document comprising the steps of:
forming a pattern on a surface of a clear plastic sheet defining the core layer of said document;
vapor depositing one of a thin layer of a selected metal and a metal compound on a designated area of the formed pattern for producing a patterned layer and causing a light pattern to be produced corresponding to the formed pattern in response to incident light;
attaching a selected number of clear plastic buffer layers to the patterned layer formed on said surface of the core layer, arbitrarily defining said surface as the top surface, and a like number of clear plastic buffer layers on the bottom surface of the core layer; the first clear plastic layer being of approximately the same thickness as the second clear plastic layer; and
selectively modifying the thin layer of said selected metal and metal compound to customize the document.

Metal Card

US 2011/0189620 (2011; Herslow) discloses a method and apparatus for treating a selected region of a metal layer, used to form a metal card, by annealing the selected metal region so the selected region becomes soft and ductile, while the rest of the metal layer remains stiff. The softened, ductile, selected metal region can be embossed with reduced power and with reduced wear and tear on the embossing equipment. Alternatively, the annealed metal layer can undergo additional processing steps to form an assembly which can then be embossed. The method may include the use of a fixture for holding the metal layer, with the fixture having a window region for enabling heat to be applied to soften the region of the metal layer within the window region. The fixture includes apparatus for cooling the portion of the metal layer outside of the window region and for preventing the temperature of the metal layer outside the window region from rising above predetermined limits.

Ferrite

U.S. Pat. No. 8,158,018 (2012; TDK) discloses a ferrite sintered body of the present invention contains main components consisting of 52 to 54 mol % $Fe_2O_3$, 35 to 42 mol % MnO and 6 to 11 mol % ZnO as oxide equivalents and additives including Co, Ti, Si and Ca in specified amounts, and has a temperature at which the power loss is a minimal value (bottom temperature) of higher than 120.degree. C. in a magnetic field with an excitation magnetic flux density of 200 mT and a frequency of 100 kHz, and a power loss of 350 kW/m·sup.3 or less at the bottom temperature.

U.S. Pat. No. 7,948,057 (2011; TDK) discloses a ferrite substrate, a winding-embedded ferrite resin layer, and an IC-embedded ferrite resin layer are laminated, the ferrite substrate has a ferrite first protruding part that protrudes into the ferrite resin layer from the surface thereof, the winding inside the ferrite resin layer is arranged winding around the first protruding part, and the IC overlaps the first protruding part in the resin layer. According to this configuration, high integration can be achieved, and the IC is arranged at a site where the ferrite first protruding part, the height of which fluctuates little as a result of thermal expansion, overlaps the ferrite resin layer, the thickness of which is thinned by the first protruding part and varies little as a result of thermal expansion, minimizing variations in the gap between the winding and the IC as a result of thermal expansion, and achieving greater stability of electrical characteristics.

U.S. Pat. No. 6,817,085 (2004; TDK) discloses a method of manufacturing a multi-layer ferrite chip inductor array including an element main body composed by laminating a ferrite layer and a conductor layer in such a manner that the laminated face thereof is vertical with an element mounting surface. The method also includes furnishing a plurality of coil shaped internal conductors within the element main body, in which a coiling direction of the coil shaped internal conductor is in parallel with the element mounting surface, forming the ferrite sheets with through-holes and printing the ferrite sheets with a plurality of coil shaped internal conductors and conductor patterns with an electrically conductive material.

U.S. Pat. No. 6,329,958 (2001; TDK) discloses an antenna structure may be formed by arranging a current-restricting structure upon a conductive surface. The current-restricting structure may be formed from a ferrite material, and may be in forms including a belt, tiles, or a patterned deposited layer. The conductive surface may be associated with a vehicle or structure. The current-restricting structure alters the paths taken by current on or beneath the conductive surface when a voltage is applied between portions of the surface.

SUMMARY

It is an object of the invention to improve coupling between an RFID reader and a chip module in a smart card having a metal or metallized layer. Generally, various modifications and/or additions may be made to the structure of such smart cards to offset the effects of shielding by the metal or metallized card body substrates during electromagnetic coupling, with the goal of improving coupling between the smart card and an external RFID (electromagnetic) reader. A dual interface (DI) smart card has contact pads (CP) extending through an opening in the metal layer for interfacing with an external contact (electrical) reader.

Generally, a dual-interface smart card comprises a booster antenna (BA) with coupler coil (CC) in its card body (CB), and a metallized face plate (202, 302) having a window opening (220, 320) for an antenna module (AM) having a module antenna (MA). Attenuation caused by the metallized face plate may be reduced (overall performance may be improved) by one or more of
  making the window opening substantially larger than the antenna module (AM),
  providing perforations through the face plate, disposing ferrite material between the face plate and the booster antenna,
  modifying contact pads (CP) on the antenna module (AM),
  disposing a compensating loop (CL) under the booster antenna (BA),
  offsetting the antenna module (AM) with respect to the coupler coil (CC),
  arranging the booster antenna as a quasi-dipole,
  providing the module antenna (MA) with capacitive stubs, and
  disposing a ferrite element (FE) in the antenna module (AM) between the module antenna (MA) and the contact pads (CP).

A dual-interface smart card having a booster antenna with coupler coil in its card body, and a metallized face plate having a window opening for the antenna module. Performance may be improved by one or more of making the window opening substantially larger than the antenna module, providing perforations through the face plate, disposing ferrite material between the face plate and the booster antenna. Additionally, by one or more of modifying contact pads on the antenna module, disposing a compensating loop under the booster antenna, offsetting the antenna module with respect to the coupler coil, arranging the booster antenna as a quasi-dipole, providing the module antenna with capacitive stubs, and disposing a ferrite element in the antenna module between the module antenna and the contact pads.

According to an embodiment of the invention, a smart card having a metallized face plate with a window opening for accepting an antenna module, and a card body with a booster antenna including a coupler coil, wherein the window opening has a baseline size approximately equal to a size of the antenna module, may be characterized in that the window opening is substantially larger than the antenna module. The window opening may be at least 10% larger than the antenna module, resulting in a gap between inner edges of the window opening and the antenna module. A ferrite layer may be disposed between the face plate and the booster antenna. A plurality of perforations may be formed in the face plate extending around at least one of the window opening and the periphery of the face plate. At least some of these perforations may reduce the amount of faceplate material in an area surrounding the window opening or around the periphery of the face plate by 25-50%. A compensation loop may be disposed behind the booster antenna. The compensation loop may have a gap, and two free ends, may comprise a conductive material such as copper, and may comprise ferrite.

One or more of the following features may be included in the smart card:
  the booster antenna may be configured as a quasi-dipole, with or without a coupler coil;
  the booster antenna may be provided with an extension;
  the booster antenna may comprise two overlapping booster antennas;
  the booster antenna may be provided primarily in an upper portion of the smart card;
  the module antenna may be offset from the coupler coil.

The smart card may further comprise at least one of the following features:
  a ferrite element may be disposed between the module antenna and contact pads of the antenna module;
  capacitive stubs may be added to the module antenna;
  the module antenna may comprise two separate coils;
  the module antenna may comprise two windings connected in a quasi-dipole configuration;
  perforations in the contact pads of the antenna module.

According to an embodiment of the invention, a method of minimizing attenuation of coupling by the face plate of a metallized smart card having a booster antenna with a coupler coil in its card body, may comprising one or more of:
  making a window opening in the faceplate larger than the antenna module;
  providing perforations through the face plate;
  providing ferrite material between the face plate and the booster antenna;
  disposing a compensating loop under the booster antenna.

The antenna module may be offset with respect to the coupler coil. The booster antenna may be arranged as a quasi-dipole; the module antenna may be provided with capacitive stubs; ferrite may be provided in the antenna module between the module antenna and the contact pads. The contact pads may be trimmed or perforated.

According to an embodiment of the invention, a smartcard may comprise: a card body (CB) having a peripheral area; a booster antenna (BA) having a peripheral portion (CA) disposed in the peripheral area; and a compensation loop (CL) disposed in the peripheral area, behind the booster antenna. The smartcard may further comprise: a metallized face plate with a window opening (W) for accepting an antenna module (AM). The window opening may be substantially larger than the antenna module, resulting in a gap between inner edges of the window opening and the antenna module. A ferrite layer may be disposed between the face plate and the booster antenna. The smartcard may further comprise: a plurality of perforations in the face plate extending around at least one of the window opening and the periphery of the face plate.

The compensation loop may have a gap, and two free ends. The compensation loop may be formed as a continuous loop, with no free ends. The compensation loop may comprise a conductive material. The compensation loop may comprise ferrite. The compensation loop may be aligned with and approximately the same size as the peripheral portion of the booster antenna.

The smartcard may further comprise: an antenna module (AM) having an RFID chip, an antenna (MA), and contact pads (CP).

The booster antenna may include a coupler coil (CC). The coupler coil may be offset from the module antenna.

A ferrite element may be disposed between the module antenna and contact pads. There may be perforations in the contact pads. Ferrite material may be disposed between the face plate and the booster antenna Other objects, features and advantages of the invention(s) disclosed herein, and their various embodiments, may become apparent in light of the descriptions of some exemplary embodiments that follows.

BRIEF DESCRIPTION OF THE DRAWINGS

Reference will be made in detail to embodiments of the disclosure, non-limiting examples of which may be illustrated in the accompanying drawing figures (FIGs). The figures are generally in the form of diagrams. Some elements in the figures may be exaggerated, others may be omitted, for illustrative clarity. Some figures may be in the form of diagrams. Although the invention is generally described in the context of various exemplary embodiments, it should be understood that it is not intended to limit the invention to these particular embodiments, and individual features of various embodiments may be combined with one another. Any text (legends, notes, reference numerals and the like) appearing on the drawings are incorporated by reference herein.

DESCRIPTION

Figure 1:
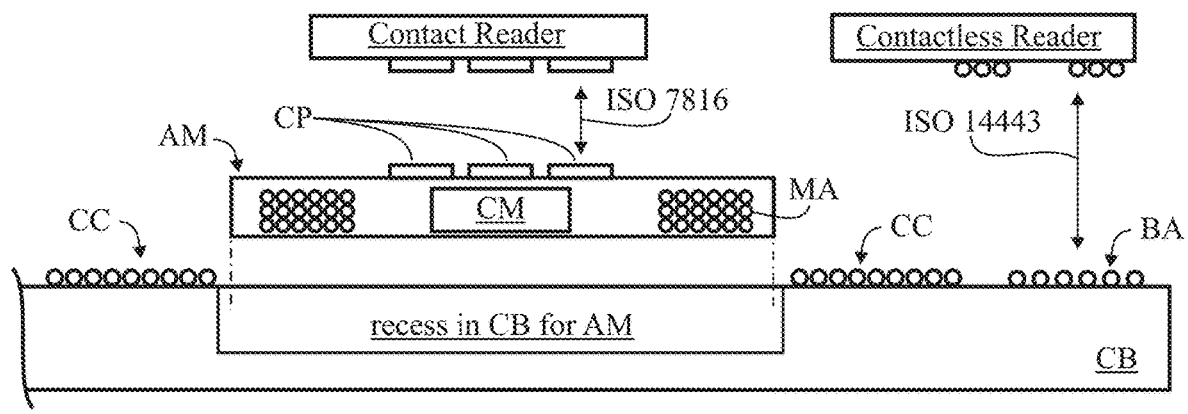
FIG. 1 is a cross-sectional view of a dual interface (DI) smart card, and readers.

Various embodiments will be described to illustrate teachings of the invention(s), and should be construed as illustrative rather than limiting. Any dimensions and materials or processes set forth herein should be considered to be approximate and exemplary, unless otherwise indicated.

In the main hereinafter, transponders in the form of secure documents which may be smart cards or national ID cards may be discussed as exemplary of various features and embodiments of the invention(s) disclosed herein. As will be evident, many features and embodiments may be applicable to (readily incorporated in) other forms of secure documents, such as electronic passports. As used herein, any one of the terms "transponder", "smart card", "data carrier", and the like, may be interpreted to refer to any other of the devices similar thereto which operate under ISO 14443 or similar RFID standard.

A typical data carrier described herein may comprise (i) an antenna module (AM) having an RFID chip or chip module (CM) and a module antenna (MA), (ii) a card body (CB) and (iii) a booster antenna (BA) disposed on the card body (CB) to enhance coupling between the module antenna (MA) and the antenna of an external RFID "reader". When "chip module" is referred to herein, it should be taken to include "chip", and vice versa, unless explicitly otherwise stated. The module antenna (MA) may comprise a coil of wire, conductive traces etched or printed on a module tape (MT) substrate for the antenna module (AM), or may be incorporated directly on the chip itself.

The booster antenna (BA) may be formed by embedding wire in an inlay substrate or card body (CB). However, it should be understood that the antenna may be formed using a processes other than by embedding wire in a substrate, such as additive or subtractive processes such as printed antenna structures, coil winding techniques (such as disclosed in U.S. Pat. No. 6,295,720), antenna structures formed on a separate antenna substrate and transferred to the inlay substrate (or layer thereof), antenna structures etched (including laser etching) from a conductive layer on the substrate, conductive material deposited on the substrate or in channels formed in the substrate, or the like. When "inlay substrate" is referred to herein, it should be taken to include "card body", and vice versa, as well as any other substrate for a secure document, unless explicitly otherwise stated.

The descriptions that follow are mostly in the context of dual interface (DI, DIF) smart cards, and relate mostly to the contactless operation thereof. Many of the teachings set forth herein may be applicable to electronic passports and the like having only a contactless mode of operation. Generally, any dimensions set forth herein are approximate, and materials set forth herein are intended to be exemplary.

Generally, coupling between the module antenna (MA) and the antenna of an external RFID reader may be enhanced by incorporating a booster antenna (BA) on the card body (CB). In some respects, a booster antenna (BA) is similar to a card antenna (CA). However, in contrast with a card antenna (CA) which is directly electrically connected with the RFID chip or chip module (such as in U.S. Pat. No. 7,980,477), the booster antenna (BA) is inductively coupled with the module antenna (MA) in the antenna module (AM) which may be connected with the RFID chip (CM). Such inductive (electromagnetic) coupling may be more difficult to accomplish than a direct electrical connection. The booster antenna (BA) may be referred to as a card antenna (CA). The booster antenna (BA) may have a coupler coil (CC) associated therewith which is arranged to be in close proximity and closely coupled with the module antenna (MA).

As used herein, the term "coupling" (and variants thereof) refers to inductive, magnetic, capacitive or reactive coupling (including combinations thereof, any of which may be referred to as "inductive coupling") between two elements relying on the generation of an electromagnetic field by a given element and the reaction to (interaction with) the field(s) by another element. In contrast thereto, the term "connecting" (and variants thereof) refers to two elements being electrically connected with one another wherein the interaction between the two elements results from the flow of electrons between the two elements. Typically, two elements which are inductively coupled with one another are not electrically connected with one another. Elements which are coils of wire such as a module antenna MA and a coupler coil CC disposed near each other are generally inductively coupled with one another, without any electrical connection between the two elements. In contrast thereto, the module antenna MA is generally electrically connected with the RFID chip (CM) element. The windings and coils of the booster antenna BA, such as outer winding OW, inner winding IW and coupler coil CC elements, are generally electrically connected with one another, but may also exhibit inductive coupling with one another. The module antenna MA and coupler coil CC are not electrically connected with one another, but are inductively coupled (or "transformer coupled") with one another.

The booster antenna BA (and other features) disclosed herein may increase the effective operative ("reading") distance between the antenna module AM and an external contactless reader with capacitive and inductive coupling. With reading distances typically on the order of only a few centimeters, an increase of 1 cm can represent a significant improvement.

Various embodiments will be described to illustrate teachings of the invention(s), and should be construed as illustrative rather than limiting. In the main hereinafter, transponders in the form of secure documents which may be smart cards or national ID cards may be discussed as exemplary of various features and embodiments of the invention(s) disclosed herein. As will be evident, many features and embodiments may be applicable to (readily incorporated in) other forms of secure documents, such as electronic passports. As used herein, any one of the terms "transponder", "smart card", "data carrier", and the like, may be interpreted to refer to any other of the devices similar thereto which operate under ISO 14443 or similar RFID standard.

A typical data carrier described herein may comprise (i) an antenna module (AM) having an RFID chip or chip module (CM) and a module antenna (MA), (ii) a card body (CB) and (iii) a booster antenna (BA) disposed on the card body (CB) to enhance coupling between the module antenna (MA) and the antenna of an external RFID "reader". When "chip module" is referred to herein, it should be taken to include "chip", and vice versa, unless explicitly otherwise stated. The module antenna (MA) may comprise a coil of wire, conductive traces etched or printed on a module tape (MT) substrate for the antenna module (AM), or may be incorporated directly on the chip itself.

The booster antenna (BA) may be formed by embedding wire in an inlay substrate or card body (CB). However, it should be understood that the antenna may be formed using a processes other than by embedding wire in a substrate, such as additive or subtractive processes such as printed antenna structures, coil winding techniques (such as disclosed in U.S. Pat. No. 6,295,720), antenna structures formed on a separate antenna substrate and transferred to the inlay substrate (or layer thereof), antenna structures etched (including laser etching) from a conductive layer on the substrate, conductive material deposited on the substrate or in channels formed in the substrate, or the like. When "inlay substrate" is referred to herein, it should be taken to include "card body", and vice versa, as well as any other substrate for a secure document, unless explicitly otherwise stated.

The descriptions that follow are mostly in the context of dual interface (DI, DIF) smart cards, and relate mostly to the contactless operation thereof. Many of the teachings set forth herein may be applicable to electronic passports and the like having only a contactless mode of operation. Generally, any dimensions set forth herein are approximate, and materials set forth herein are intended to be exemplary.

Generally, coupling between the module antenna (MA) and the antenna of an external RFID reader may be enhanced by incorporating a booster antenna (BA) on the card body (CB). In some respects, a booster antenna (BA) is similar to a card antenna (CA). However, in contrast with a card antenna (CA) which is directly electrically connected with the RFID chip or chip module (such as in U.S. Pat. No. 7,980,477), the booster antenna (BA) is inductively coupled with the module antenna (MA) which may be connected with the RFID chip (CM). Such inductive coupling may be more difficult to accomplish than a direct electrical connection.

As used herein, the term "coupling" (and variants thereof) refers to inductive, magnetic, capacitive or reactive coupling (including combinations thereof, any of which may be referred to as "inductive coupling") between two elements relying on the generation of an electromagnetic field by a given element and the reaction to (interaction with) the field(s) by another element. In contrast thereto, the term "connecting" (and variants thereof) refers to two elements being electrically connected with one another wherein the interaction between the two elements results from the flow of electrons between the two elements. Typically, two elements which are inductively coupled with one another are not electrically connected with one another. Elements which are coils of wire such as a module antenna MA and a coupler coil CC disposed near each other are generally inductively coupled with one another, without any electrical connection between the two elements. In contrast thereto, the module antenna MA is generally electrically connected with the RFID chip (CM) element. The windings and coils of the booster antenna BA, such as outer winding OW, inner winding IW and coupler coil CC elements, are generally electrically connected with one another, but may also exhibit inductive coupling with one another. The module antenna MA and coupler coil CC are not electrically connected with one another, but are inductively coupled (or "transformer coupled") with one another.

The booster antenna BA (and other features) disclosed herein may increase the effective operative ("reading") distance between the antenna module AM and an external contactless reader with capacitive and inductive coupling. With reading distances typically on the order of only a few centimeters, an increase of 1 cm can represent a significant improvement.

FIG. 1 is a cross-sectional view of a portion of an exemplary smart card having an antenna module AM disposed in a recess in a card body CB. The antenna module AM has a chip module CM. The antenna module AM has contact pads CP for a contact interface with an external Contact Reader (ISO 7816). The antenna module AM has a module antenna MA for a contactless interface with an external contactless reader (ISO 14443). A booster antenna BA is disposed around the periphery of the card body CB, and has a coupler coil CC is disposed around the recess in the card body CB. With the antenna module AM disposed in the recess, the module antenna MA is closely coupled with the coupler coil CC of the booster antenna BA. The coupler coil CC may be arranged to be under the module antenna MA rather than surrounding it.

Figure 3A:
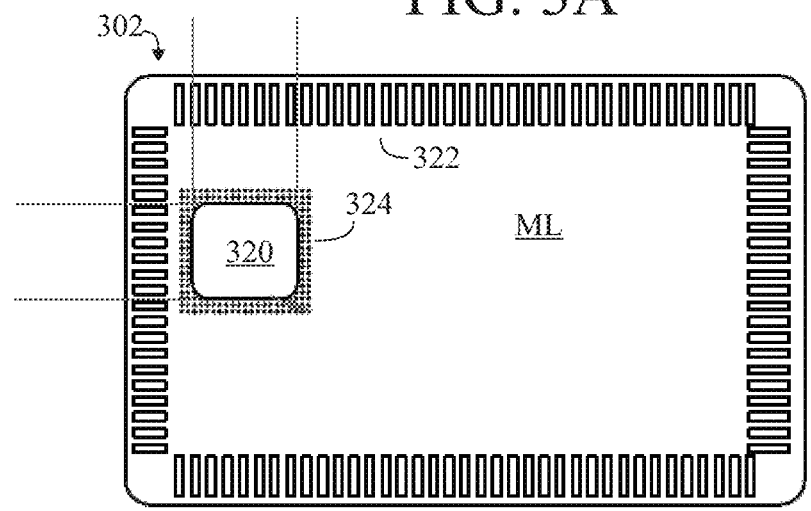
FIGS. 3A,B,C are diagrammatic top views of embodiments of a face plate (ML) for a smart card.
Figure 4A:
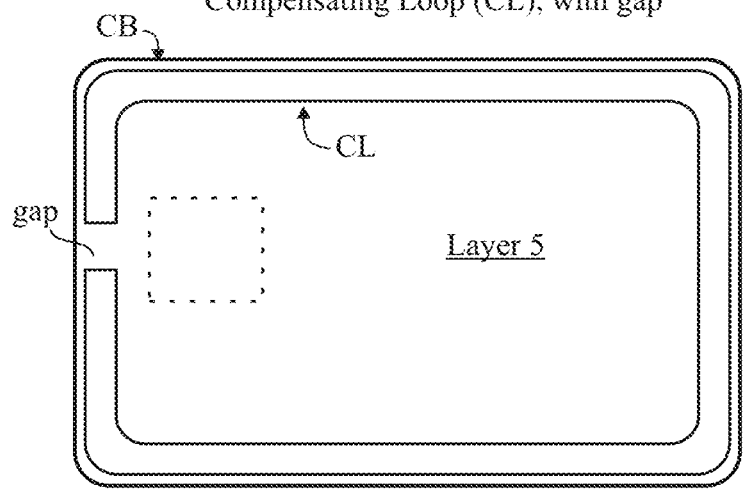
FIG. 4A is diagram of a layer with a compensation loop having a gap.

As shown in US 2012/0074233, for example FIGS. 3A and 4A therein, the booster antenna BA (or card antenna CA) may comprise an outer winding OW (or D) and an inner winding IW (or E), connected in reverse phase with one another as a quasi dipole. No coupler coil (CC) is shown.

As shown in U.S. Ser. No. 13/600,140, for example FIGS. 3 and 4 therein, a quasi-dipole booster antenna BA may additionally comprise an inner coupler coil CC. The coupler coil CC is shown without detail, represented by a few dashed lines. (Some details of the coupler coil CC construction, and how it may be arranged in various orientations (clockwise, counterclockwise) and connected with the outer winding OW and inner winding IW are set forth in FIGS. 3A-3D.)

Figure 1A:
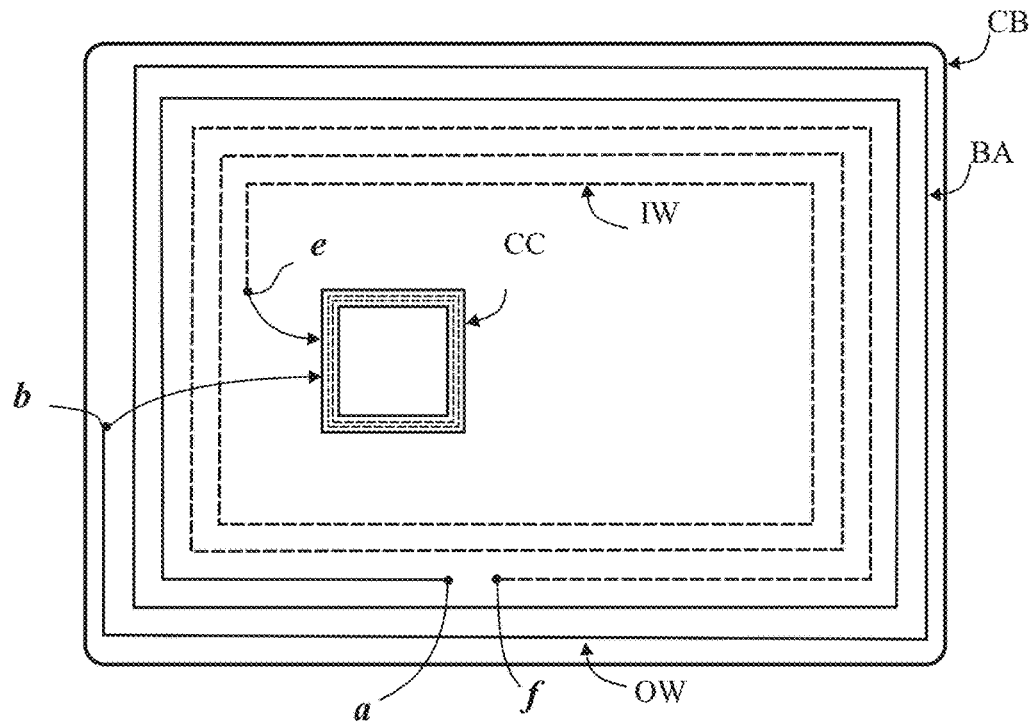
FIG. 1A is a diagrammatic top view of a booster antenna (BA) with coupler coil (CC).

FIG. 1A is a diagrammatic top view of a smart card body CB with a booster antenna BA and antenna module AM. The booster antenna BA has a coupler coil CC incorporated therewith. The following abbreviations may appear in the figure.

CB—Card Body or Inlay Substrate
BA—Booster Antenna or Card Antenna (CA)
OW—Outer Winding of BA—approx. 2-3 turns
IW—Inner Winding of BA—approx. 2-3 turns
CC—Coupler Coil—approx. 10 turns
IE—Inner End of OW, IW or CC
OE—Outer End of OW, IW or CC The following may be noted:
The Inner End (IE, a) of the Outer Winding (OW) is "free end"
The Outer End (OE, f) of the Inner Winding (IW) is "free end"
The Outer End (OE, b) of the OW is connected to one end of CC
The Inner End (IE, e) of the IW is connected to another end of CC
The outer winding OW may be laid clockwise (CW) from IE (a) to OE (b)
The inner winding IW may be laid clockwise (CW) from IE (e) to OE (f)

The booster antenna BA comprises an outer winding OW and an inner winding IW, both extending substantially around the periphery of the card body CB. Each of the inner and outer windings has an inner end IE and an outer end OE. The outer end OE (b) of the outer winding OW is connected with the inner end IE (e) of the inner winding IW, via a coupler coil CC. The inner end IE (a) of the outer winding OW and the outer end OE (f) of the inner winding IW may be left unconnected, as "free ends". The overall booster antenna BA comprising outer winding OW, coupler coil CC and inner winding IE is an open circuit, and may be referred to as a "quasi-dipole"—the outer winding OW constituting one pole of the dipole, the inner winding IW constituting the other pole of the dipole—center fed by the coupler coil CC.

The booster antenna BA may be formed using insulated, discrete copper wire disposed (such as ultrasonically bonded) around (inside of) the perimeter (periphery) of a card body CB (or inlay substrate, or data carrier substrate, such as formed of thermoplastic). The booster antenna BA comprises an outer winding OW (or coil, D) and an inner winding IW (or coil, E), and further comprises a coupler coil CC, all of which, although "ends" of these various coil elements are described, may be formed from one continuous length of wire (such as 80 μm self-bonding wire) which may be laid upon or embedded in the card body CB. More particularly, The outer winding OW may be formed as a spiral having a number (such as 2-3) of turns and having an inner end IE at point "a" and an outer end OE at point "b". The outer winding OW is near (substantially at) the periphery (perimeter) of the card body CB. The inner end IE ("a") of the outer winding OW is a free end.

The coupler coil CC may be formed as a spiral having a number (such as approximately 10) of turns and having two ends "c" and "d". The end "c" may be an outer end OE or an inner end IE, the end "d" may be an inner end IE or an outer end OE.

The inner winding IE may be formed as a spiral having a number (such as 2-3) of turns and having an inner end IE "e" and an outer end OE "f". The inner winding IW is near (substantially at) the periphery of the card body CB, inward of the outer winding OW. The outer end OE ("f") of the inner winding IW is a free end. In FIG. 3, the inner winding IW is shown in dashed lines, for illustrative clarity.

The inner end IE of the outer winding OW is a "free end" in that it is left unconnected. Similarly, the outer end OE of the inner winding IW is a "free end" left unconnected.

The outer winding OW, coupler coil CC and inner winding IW may be formed as one continuous structure, using conventional wire embedding techniques. It should be understood that references to the coupler coil CC being connected to ends of the outer winding (OW) and inner winding (IW) should not be construed to imply that coupler coil CC is a separate entity having ends. Rather, in the context of forming one continuous structure of outer winding OW, coupler coil CC and inner winding IW, "ends" may be interpreted to mean positions corresponding to what otherwise would be actual ends—the term "connected to" being interpreted as "contiguous with" in this context.

The dimensions of the card body CB may be approximately 54 mm×86 mm. The outer dimension of the outer winding OW of the booster antenna BA may be approximately 80×50 mm. The wire for forming the booster antenna BA may having a diameter (d) of approximately 100 μm (including, but not limited to 80 μm, 112 μm, 125 μm.

The inner winding IW may be disposed within the outer winding OW, as illustrated, on a given surface of the card body CB (or layer of a multi-layer inlay substrate). Alternatively, these two windings of the booster antenna BA may be disposed on opposite surfaces of the card body CB, substantially aligned with one another (in which case they would be "top" and "bottom" windings rather than "outer" and "inner" windings). The two windings of the booster antenna BA may be coupled in close proximity so that voltages induced in them may have opposite phase from one another. The coupler coil CC may be on the same surface of the card body CB as the outer and inner windings.

The turns of the outer winding OW and inner winding IW of the booster antenna BA may be at a pitch of 0.2 mm (200 μm), resulting in a space of approximately one wire diameter between adjacent turns of the outer winding OW or inner winding IW. The pitch of the turns of the coupler coil CC may be substantially the same as or less than (stated otherwise, not greater than) the pitch of turns of at least one of the outer winding OW and inner winding IW—for example 0.15 mm (150 μm), resulting in space smaller than one wire diameter between adjacent turns of the coupler coil (CC). Self-bonding copper wire may be used for the booster antenna BA. The pitch of both the outer/inner windings OW/IW and the coupler coil CC may both be approximately 2× (twice) the diameter of the wire (or width of the conductive traces or tracks), resulting in a spacing between adjacent turns of the spiral(s) on the order of 1 wire diameter (or trace width). The pitches of the outer winding OW and the inner winding IW may be substantially the same as one another, or they may be different than each other.

More turns of wire for the coupler coil CC can be accommodated in a given area—for example, by laying two "courses" of wire, one atop the other (with an insulating film therebetween, if necessary), in a laser-ablated trench defining the area for the turns of the coupler coil CC.

A substrate or card body CB with the booster antenna BA formed thereon may be prepared by a first manufacturer and constitute an interim product (which, without the antenna module AM, may be referred to as a "data carrier component"). Subsequently, a second manufacturer may mill (or otherwise form) a recess in the card body CB, at the interior of the coupler coil CC (see FIG. 1) and install the antenna module AM (with its module antenna MA) in the recess. (Of course, the data carrier component can be provided by the first manufacturer, with the recess already formed.)

Reference may additionally be made to some drawings and descriptions in the following applications related to DIF (dual interface—contact and contactless) smart cards, incorporated by reference herein, such as:

Ser. No. 13/730,811 filed Dec. 28, 2012, or publication number 2012/0074233
  FIG. 1A Card Antenna CA in card body CB, contact and contactless readers
  FIG. 1B Card Antenna CA in card body CB, ferrite in card body CB
  FIG. 1D ferrite element FE in AM between module antenna MA and contact pads CP
  FIGS. 3A, 4A Quasi-Dipole Booster Antenna BA, without coupler coil CC
  FIG. 4I,J ferrite in card body CB
  FIG. 6A mobile phone sticker MPS with ferrite
  FIG. 6B ferrite shielding element 670, adhesive both sides
  FIG. 8 (Ser. No. 13/730,811) card antenna CA primarily at top half of card body CB Ser. No. 13/600,140 filed Aug. 30, 2012
  FIG. 2A booster antenna BA, no coupler coil CC
  FIG. 3 booster antenna BA with coupler coil CC
  FIGS. 3A-3D various configurations for the coupler coil CC
  FIG. 4 BA with CC, antenna module AM with module antenna MA
  FIG. 5H booster antenna with extension
  FIGS. 5I-K two booster antennas
  FIGS. 6A-C BA disposed at top half of card body CB U.S. Ser. No. 14/020,884 (U.S. Pat. No. 9,033,250) discloses a booster antenna (BA) for a smart card comprises a card antenna (CA) component extending around a periphery of a card body (CB), a coupler coil (CC) component at a location for an antenna module (AM), and an extension antenna (EA) contributing to the inductance of the booster antenna (BA). A method of wire embedding is also disclosed, by controlling a force and ultrasonic power applied by an embedding tool at different positions on the card body (CB).

Figure 1B:
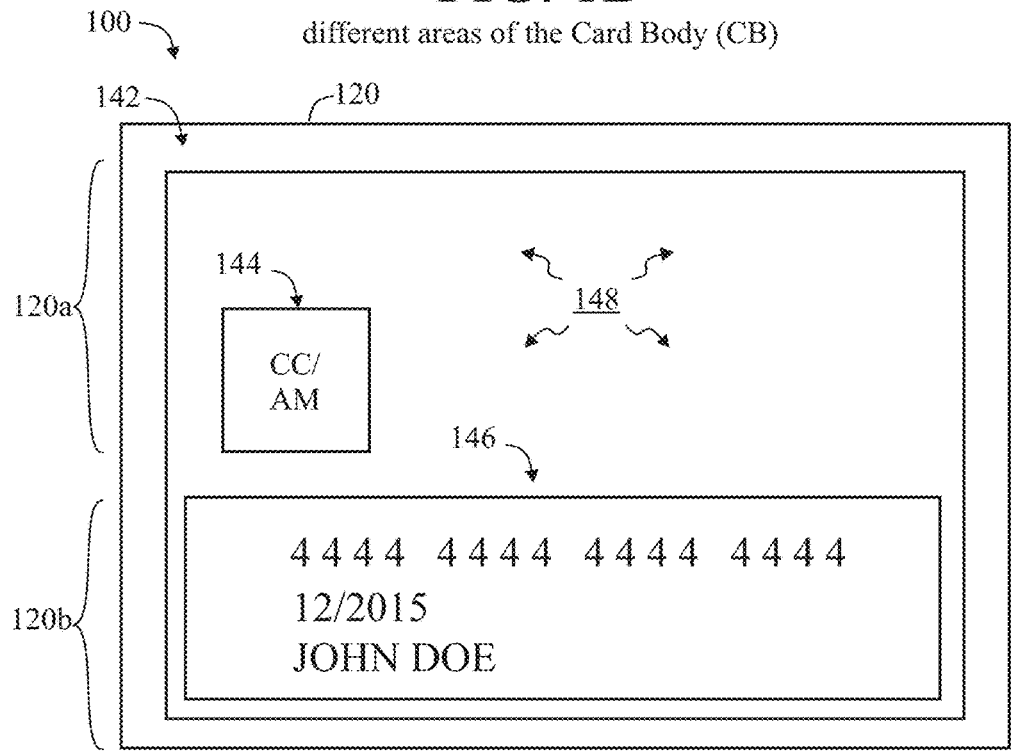
FIG. 1B (compare FIG. 1A of U.S. Ser. No. 14/020,884) is a top view of a card body (CB) for a smartcard.

FIG. 1B (compare FIG. 1A of Ser. No. 14/020,884) shows a card body (CB) 120 has a surface with an overall surface area, such as approximately 54 mm×86 mm~=4600 mm2. An upper portion 120a of the card body CB may constitute approximately half (such as 50-70%) of the overall surface area of the card body CB, and a lower portion 120b of the card body CB may constitute a remaining approximately half (such as 30-50%) of the overall surface area of the card body CB.

A "peripheral" area 142 of the surface of the card body CB extends around the periphery of the card body CB in at least the upper portion 120a thereof, and may have a width of up to approximately 5 mm. The card antenna CA component (or, peripheral component of the booster antenna) may be disposed in this first area. The width of the first, peripheral area 142 may be greatest at the top edge of the card body CB, of medium width at the side edges of the card body CB, and least at the bottom edge of the card body CB.

A "coupling" area 144 of the surface of the card body CB is located in an interior area (within the peripheral area 142) of the card body CB, in the upper portion 120a thereof, at a position corresponding to the location of the antenna module AM, and may be of approximately the same size as the antenna module AM, such as approximately 8.2 mm×10.8 mm for a 6-contact module and 11.8 mm×13 mm for an 8-contact module.

An "embossing" area 146 of the surface of the card body CB is located in an interior area (within the peripheral area 142) of the card body CB, in the lower portion 120b thereof, is separate from the peripheral area 142 and the coupling area 144, and may constitute most (such as 80-90%) of the lower portion 120b of the card body CB.

A "remaining" (or "residual") area 148 of the surface of the card body CB is located in an interior area (within the peripheral area 142) of the card body CB, in the upper portion 120a thereof, is separate from the peripheral area 142 and the coupling area 144, and may constitute most (such as 60-80%) of the upper portion 120b of the card body CB. The card antenna 132 and coupler coil 134 are not disposed in this remaining area 148—in other words, are disposed substantially entirely in areas (142, 144) other than the remaining area 148 (and other than the embossing area 146).

An additional booster antenna component, referred to herein as an antenna extension (EA) component, may be disposed in remaining (or residual) area 148 of the surface of the card body CB. The antenna extension EA may comprise several turns (or traces) of wire (or other conductive material), and may be either (i) connected with one or both of the card antenna CA and coupler coil CC or (ii) not connected with either of the card antenna CA and coupler coil CC.

Figure 1C:
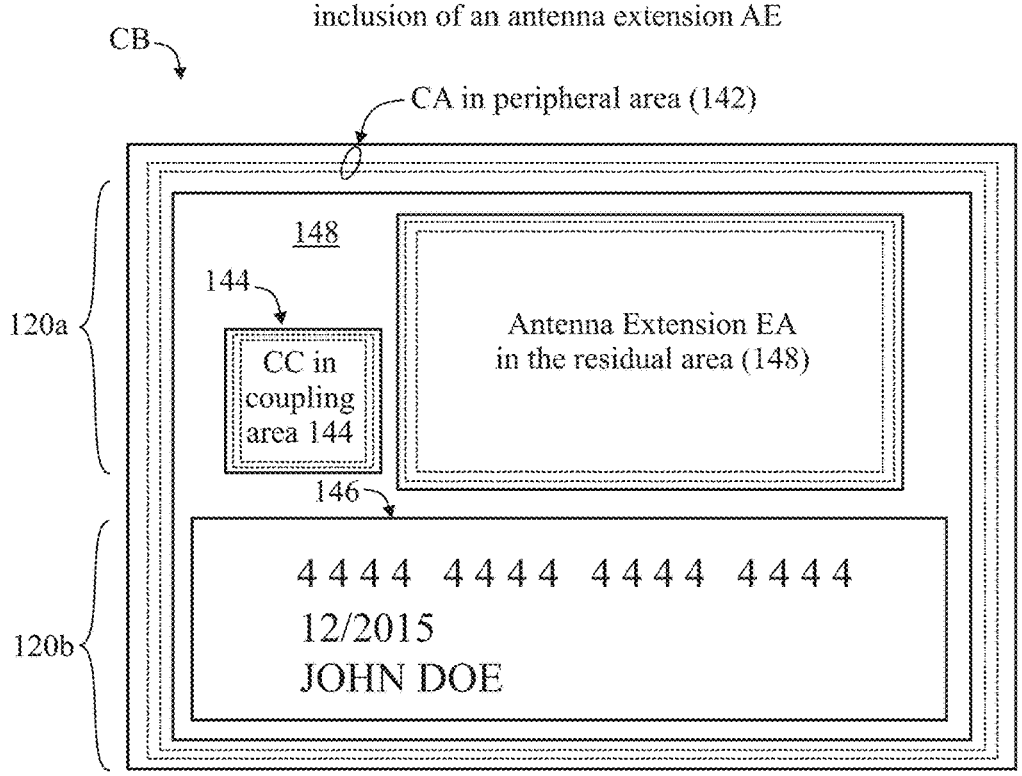
FIG. 1C (compare FIG. 3B of U.S. Ser. No. 14/020,884) is a diagram illustrating various areas of a card body CB of a smartcard.
Figure 3B:
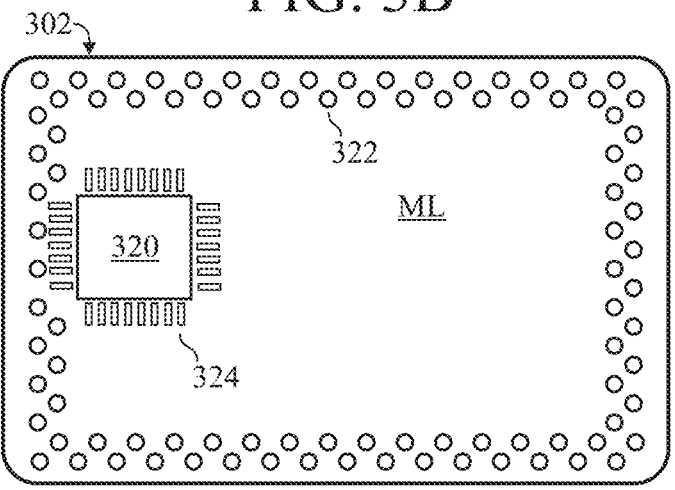

FIG. 1C (compare FIG. 3B of Ser. No. 14/020,884) expands upon FIG. 1B and illustrates, schematically and generally, the addition (inclusion) of an extension antenna (EA) component of a booster antenna BA disposed in the residual area (148) of a smart card. The extension antenna (EA) is shown only generally in this figure, it is shown in greater detail in other figures in U.S. Ser. No. 14/020,884.

Construction of a Metallized Card

Some smart cards, including dual interface (DI) smart cards, have a metal (or metallized) top layer, or "face plate", substantially the size of the card body. Having a metal layer is technically disingenuous in that a it may significantly reduce coupling between the card and an external contactless reader. Nevertheless, the feature may be important for vanity purposes.

Figure 2:
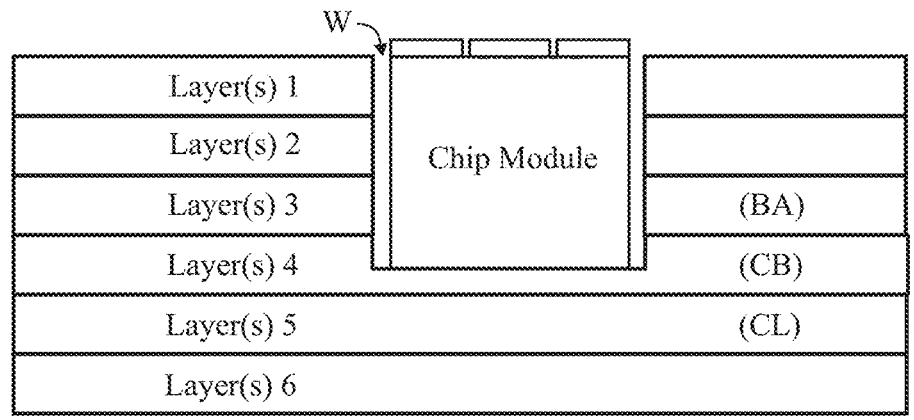
FIG. 2 is a diagrammatic cross-sectional view of a smart card with metallization.

FIG. 2 is a very generalized, simplified, diagrammatic cross-sectional view illustrating some exemplary layers of an exemplary "metal" (or metallized) smart card. The layers are numbered for reference purposes only, not to indicate a particular sequence. The layers may be rearranged. Some layers may be omitted. Some layers may be applicable to either non-metal smart cards or metallized smart cards. Some of the layers may comprise more than one layer. Some layers may be combined with other layers.

Layer 1 printed sheet, overlay anti-scratch, etc
Layer 2 separate metal layer or metallized foil
Layer 3 booster antenna BA with coupler coil CC
Layer 4 card body CB
Layer 5 compensation frame (back side of card body) on metallized or non-metallized
Layer 6 printed sheet, underlay anti-scratch, magnetic stripe, etc A chip module (CM) is shown disposed in a window "W" (opening) extending into the smart card, from the front (top, as viewed) surface thereof through the metallized foil (Layer 2) and into the card body (Layer 4). The chip module (CM) has contact pads (CP) on its front surface for interfacing with an external contact reader. The chip module may be a dual interface (DI) antenna module (AM) having a module antenna (MA) for interfacing, via the booster antenna (BA) with coupler coil (CC), with an external contactless reader. The antenna module (AM) may fit within the inner area of the coupler coil (CC). Compare FIG. 1.

Figure 2A:
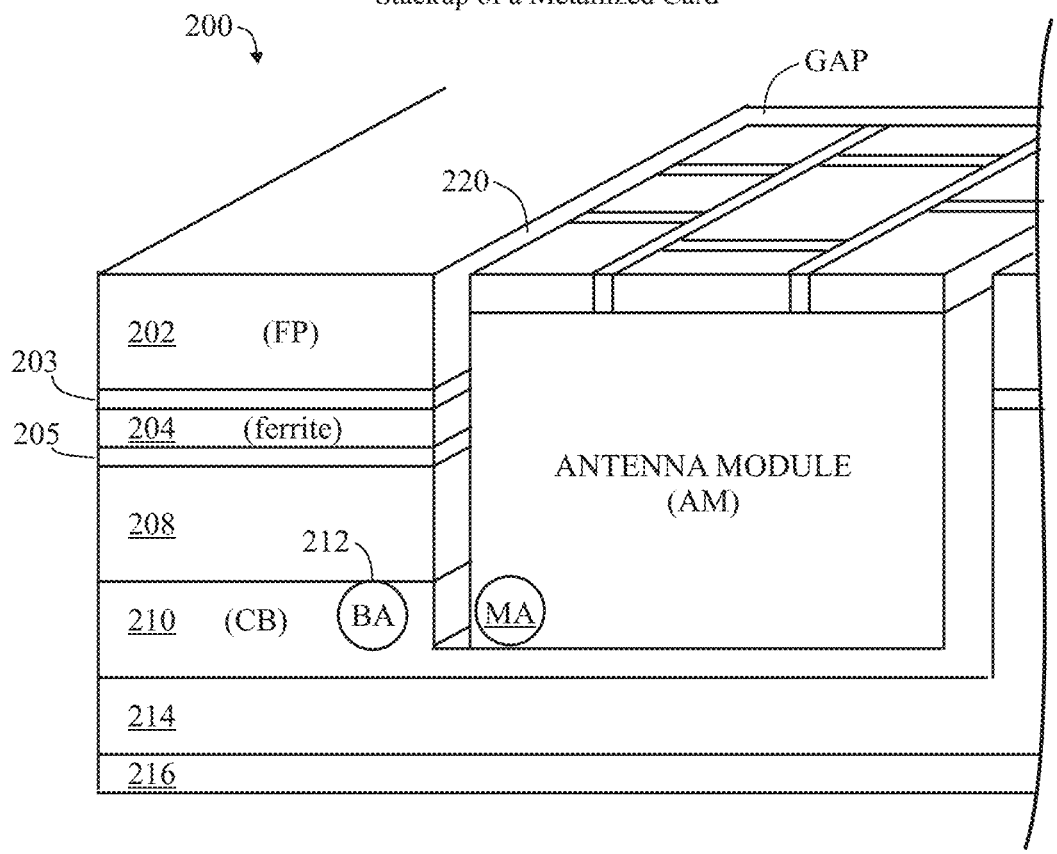
FIG. 2A is a partial diagrammatic perspective view of a smart card with metallization.

FIG. 2A shows an exemplary stackup (sequence of layers) for a metallized smart card 200, having the following layers, structures and components. Exemplary dimensions may be presented. All dimensions are approximate. Thickness refers to vertical dimension in the figure.

A top layer 202 may be a metal (or metallized) layer 202, such as 250 µm thick stainless steel, and may be referred to as a "face plate". Compare "Layer 1". This top layer 202 may be as large as the overall smart card, such as approximately 50 mm×80 mm.

A layer 203 of adhesive, such as 40 µm thick of polyurethane

A layer 204 of ferrite material, such as 60 µm thick sheet of soft (flexible) ferrite A layer 205 of adhesive, such as 40 µm thick of polyurethane A layer 208 of plastic material, such as 50-100 µm thick PVC, which may function as a spacer (separating layers and components below from those above)

A layer 210 of plastic material, such as 150-200 µm thick PVC, which may function as the card body (CB). Compare "Layer 4".

Wire 212, such as 112 µm diameter wire, forming the booster antenna (BA) with coupler coil (CC) Compare FIG. 1 Only one wire cross-section is shown, for illustrative clarity.

A layer 214 of plastic material, such as 150 µm thick PVC, which may include printing, magnetic stripe, etc.

A layer 216 of plastic material, such as 50 µm thick PVC, which may serve as an overlay The overall thickness of the smart card 200 (layers 202, 203, 204, 208, 210, 214, 216) may be approximately 810 µm (0.81 mm).

A window opening 220 ("W") may extend into the smart card from the face plate 202, through intervening layers, into the card body layer 210. A dual interface (DI) antenna module (AM), with module antenna (MA) may be disposed in the window opening 220. Compare FIG. 1 The window opening 220 may extend completely through the layer 210, in which case the antenna module (AM) would be supported by the underlying layer 214.

The coupler coil (CC) of the booster antenna (BA) may surround the window opening 220 so as to be closely coupled with the module antenna (MA) of the antenna module (AM). Compare FIG. 1 Alternatively, the coupler coil (CC) may be disposed in the card body (CB) so as to be underneath the module antenna (MA) of the antenna module (AM).

The antenna module (AM) may measure approximately 12×13 mm (and approximately 0.6 mm thick). The window opening 220 ("W") in the face plate 202 may be approximately the same size as the antenna module (AM)—i.e., approximately 12×13 mm. In this "baseline" configuration, the chip activation distance may be approximately 15 mm. (Chip activation distance is similar to read distance, and represents the maximum distance at which the chip module may be activated (for reading) by an external reader. As a general proposition, more is better, 15 mm is not very good, 20 mm or 25 mm would be better. The chip activation distance in a metallized smart card is handicapped by attenuation of the electromagnetic field associated with the booster antenna attributable to the metallic face plate 202 (Layer 1).

According to a feature of the invention, the window opening 220 in the face plate 202 is made to be significantly larger than the antenna module (AM) so as to offset shielding and enhance coupling, thereby increasing the activation distance. For example, given an antenna module (AM) measuring approximately 12×13 mm, the window opening 220 can be enlarged approximately 1 mm all around, so that there is a 1 mm gap (GAP) all around the antenna module (AM). This results in the window opening measuring 14×15 mm, and having a 30% greater area (which is the area of the gap). The gap (1 mm) is approximately 10% of the cross-dimension of the un-enlarged (12×13 mm) window opening. The resulting chip activation distance may be approximately 20 mm (a 33% increase over baseline 15 mm).

the window opening 220 can be enlarged approximately 2 mm all around, so that there is a 1 mm gap (GAP) all around the antenna module (AM). This results in the widow opening having measuring 16×17 mm, and having a 75% greater area (which is the area of the gap). The gap (2 mm) is approximately 20% of the cross dimension of the un-enlarged (12×13 mm) window opening. The resulting chip activation distance may be approximately 22 mm (a 50% increase over baseline 15 mm).

The results of providing a gap and enlarging the window opening are summarized in the following Table (all numbers are approximate).

| Antenna Module | Window Opening | GAP | Comment(s) | activation distance |
|---|---|---|---|---|
| 12 × 13 mm ~156 mm² | 12 × 13 mm ~156 mm² | No GAP | Window is not larger This is the "baseline" | 15 mm "baseline" |
| 12 × 13 mm ~156 mm² | 14 × 15 mm ~210 mm² | 1 mm all around ~54 mm2 | Window is 30% larger | 20 mm 33% increase |
| 12 × 13 mm ~156 mm² | 16 × 17 mm ~272 mm² | 2 mm all around ~116 mm2 | Window is 75% larger | 22 mm 50% increase |

More generally, the window opening 220 may be increased in size (in contrast with its nominal size approximately equal to that of the antenna module AM) by at least 10%, up to at least 100%, including the values of approximately 30% and 75% in the examples above.

The gap (GAP) between the antenna module (AM) and the inner edges of the window opening 220 may allow significantly better coupling between the coupler coil (CC) of the booster antenna (BA) and the module antenna (MA) of the antenna module (AM). Activation distance improvements of up to 50% are presented. Gap sizes of 1 mm and 2 mm have been discussed, which represent enlarging the window opening by 10% and 20%, respectively. More generally, the gap may be at least 0.5 mm, including up to at least 3 mm.

The ferrite layer 204 may also improve coupling by reducing attenuation of coupling by the face plate 202, helping to concentrate the electromagnetic field between the booster antenna BA and the module antenna MA of the antenna module AM. It may be desirable that the ferrite layer 204 be as close as possible to the underside of the face plate 202. Rather than having a separate ferrite layer 204 (and adhesive layer 203), ferrite particles or powder may be mixed with an adhesive and sprayed or coated onto the underside of the face plate 202, thereby eliminating the intervening adhesive layer 203. Alternatively, rather than being in the form of a separate layer 204, the ferrite material may be particles (including nanoparticles) of ferrite embedded in an underlying layer, such as the spacer layer 208 or the card body layer 210 (in some configurations, the spacer layer 208 may be omitted).

The spacer layer 208 may also improve coupling by reducing attenuation of coupling by the face plate 202, simply by keeping the face plate 202 as far away as practical (within the confines of the form factor for smart cards) from the booster antenna 212.

In addition to the features of the enlarged window opening 220 in the face plate 202, the ferrite 204 between the face plate and layers/components below, and the spacer layer 208, various additional features for improving coupling, may be incorporated into the layers of the smart card and/or the antenna module, such as, but not limited to:

for metallic cards
  perforating the face plate, as described in greater detail with respect to FIGS. 3A,B,C
  providing a compensation frame under the booster antenna (BA). Compare Layer 5 (FIG. 2, above) and FIGS. 4A, 4B (below)
for card body layers
  disposing ferrite at strategic locations in the card body (CB), such as disclosed in FIGS. 1B, 4I,J of US 20120074233
  configuring the booster antenna (BA), or card antenna (CA) as a quasi-dipole without a coupler coil (CC), and positioning the antenna module AM so that the module antenna MA overlaps only an inner winding IW of the booster antenna, such as disclosed in FIG. 2C of US 20120038445 and in FIGS. 3A, 4A of US 20120074233, and in FIG. 2A of Ser. No. 13/600,140
  configuring the booster antenna (BA) as a quasi-dipole with a coupler coil (CC), such as disclosed in FIGS. 3, 3A-D, 4 of Ser. No. 13/600,140. Compare FIGS. 1, 1A (above)
  providing a booster antenna (BA) with an "extension", such as disclosed in FIG. 5H of Ser. No. 13/600,140
  providing overlapping booster antennas (BAs), such as disclosed in FIGS. 5I,J,K of Ser. No. 13/600,140
  providing booster antennas (BAs) primarily in an upper portion of the smart card, leaving a lower "embossing" portion free, such as disclosed in FIGS. 6A,B,C of Ser. No. 13/600,140, FIG. 8 of Ser. No. 13/730,811, and FIG. 6D of 61/697,825
  offsetting the module antenna (MA) from the coupler coil (CC) so that they are not concentric, such as disclosed in FIGS. 7A,B,C of 61/737,746 filed Dec. 15, 2012
  forming and connecting the windings of the booster antenna (BA) and coupler coil (CC) in a manner other than is shown in FIG. 1A (above), such as disclosed in FIGS. 8A-C of 61/737,746 filed Dec. 15, 2012
for the antenna module (AM)
  disposing a ferrite element between the module antenna (MA) and the contact pads (CP) of the antenna module (AM), such as disclosed in FIGS. 1D and 7C,D,E of US 20120074233
  adding capacitive stubs to the module antenna (MA), such as disclosed in FIGS. 2A,B of US 20120038445 and US 20120074233
  trimming and/or perforating the contact pads (CP) of the antenna module (AM), such as disclosed in FIGS. 2-5 of 61/693,262
  forming the module antenna (MA) as two separate coils, such as disclosed in FIG. 6A of 61/693,262
  connecting two windings of a module antenna (MA) in a quasi-dipole configuration, such as disclosed in FIG. 6B of 61/693,262

Using various combinations of these features, a baseline activation distance of 15 mm may be increased to approximately 28 mm, or more, an improvement of approximately 100%, and corresponding improvements to the reliability of communication between the chip module (CM) and an external contactless reader. It is within the scope of the invention that these features, listed above, may be incorporated into a non-metallized (no metallic face plate) smart card to significantly improve activation and read distances.

Manufacturing

An interim product may comprise the ferrite 204, adhered with adhesive 205 to the underlying spacer layer 208, and the card body layer 210 with the booster antenna 212 inlaid therein. This interim product may be referred to as a pre-laminated stack, or "prelaminate", and may have a thickness of approximately 450 μm.

The prelaminate may be delivered to a second manufacturer who will apply the faceplate 202, the bottom PVC sheet 214 and the bottom overlay 216. The faceplate 202 may be pre-punched (or otherwise machined) with the opening 220. The resulting stackup may have a pre-laminated thickness pf approximately 940 μm (0.94 mm), and after lamination (heat and pressure) have a final thickness of approximately 890 μm (0.89 mm).

In the lamination process, a plug of material may first be inserted into the window opening 220 to prevent the underlying material (ferrite 204, spacer PVC 208, card body PVC 210, etc.) from expanding upwards into the window opening 220 (and causing a resulting indent on the bottom surface of the smart card). The material for the plug may be PVC, or the metal "slug" which was removed from the faceplate to make the opening, or the like.

Typically, after lamination, the plug (if metal) is removed. If the plug was PVC, it may be left in place. The recess for the antenna module may then be machined into the layers (ferrite 204, spacer PVC 208, card body PVC 210) of the smart card, being careful (of course) not to damage the coupler coil (CC).

Perforating the Faceplate (202)

The faceplate (202), which may be referred to as a "metallized layer" ("ML"), may be perforated to improve coupling, and this would ordinarily be done prior to adding the faceplate to the stack for lamination, such as in conjunction with forming the window (220). In other words, to offset the shielding caused by the metallized layer on a smart card, the metallized layer can be perforated, removing material in locations such as around the window (220) which is approximately directly over the coupling coil (CC) and/or around the periphery of the metallized layer ML which is approximately directly over the outer winding OW and inner winding IW of the booster antenna BA. Perforating the metallized layer ML, such as with slots and holes, at these locations, may allow the electromagnetic field to operate better, such as by facilitating the radiation of magnetic flux lines. The design of the perforations may add to the aesthetics of the smart card, and may provide an optical (visible) security feature.

FIG. 3A shows that a pattern of perforations (or openings) in the form of elongated slits 322 may be formed, such as by laser etching, around the periphery of the face plate 302 (compare 202). The slits 322 may be aligned over (or under) the booster antenna BA (FIG. 1), to enhance coupling between the booster antenna BA and the antenna of an external contactless reader (FIG. 1).

FIG. 3A shows that a pattern of perforations (or openings) in the form of holes 324 may be formed, such as by laser etching, around the periphery of the opening 320 (compare 220) in the face plate 302 (compare 202, also "Layer 2"). These perforations may be aligned over (or under) the coupler coil CC (FIG. 1), to enhance coupling between the coupler coil CC (212) and the module antenna MA of an antenna module AM.

FIG. 3B shows an alternate pattern of perforations (or openings) 322 and 324 in a metallized layer (faceplate) 302. Here, the perforations 322 around the periphery of the faceplate A are in the form of holes, and the perforations 324 around the window opening 320 are in the form of slits.

Figure 3C:
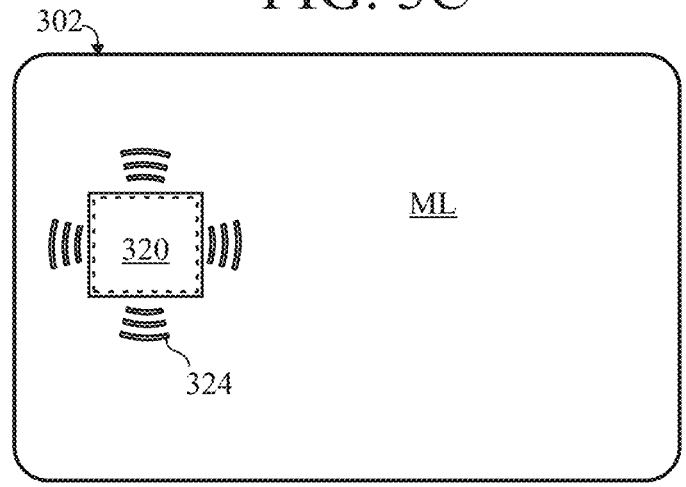

FIG. 3C shows an alternate pattern of perforations (or openings) 324 in a metallized layer (faceplate) 302. Here, the openings 324 are several arc segments of increasing radii, distributed (centered) around the window opening 320.

The perforations (or openings) 322 and 324, whether slits or holes, or other shapes, may be arranged in an aesthetically pleasing pattern, and may also serve as a security (anti-counterfeiting) measure. The perforations (or openings) 322 and 324 in the face plate 302 may be filled with a visually contrasting material, preferable non-metallic, such as artificial (plastic) mother of pearl.

The dimensions of the card body CB may be (approximately 50 mm×80 mm),
    Width 85.47 mm-85.72 mm
    Height 53.92 mm-54.03 mm
    Thickness 0.76 mm+0.08 mm The face plate 302 (or metallized layer ML) may measure approximately 86 mm×54 mm. The opening 320 (or "W") in the face plate 302 may measure approximately 8 mm×10 mm. (In the discussion of FIG. 2A, other exemplary dimensions for the antenna module AM and window opening 220 in the face plate 202 are presented and tabulated.) The peripheral area of the card body CB (or metallized layer ML) may extend 5-10 mm in from the edge(s) of the card body CB (or metallized layer)—in other words, not entirely to the periphery of the overall card body.

As shown in FIGS. 3A and 3B, there may be a plurality of (such as 20-60, or more) openings 322 disposed around the peripheral area of the face plate 302. The openings 322 may reduce the amount of metal material in the peripheral area by approximately 25%-50%, thereby permitting better coupling between the booster antenna BA and an external contactless reader.

Similarly, there may be a plurality of (such as 10-30, or more) openings 324 disposed around the window opening 320 in the face plate 302. The openings B may reduce the amount of metal material in this area by approximately 25%-50%, thereby permitting better coupling between the coupler coil CC and the module antenna MA of the antenna module AM.

Additional and Alternative Modifications to the Layers of the Card Body

Compensation Loop

Figure 4B:
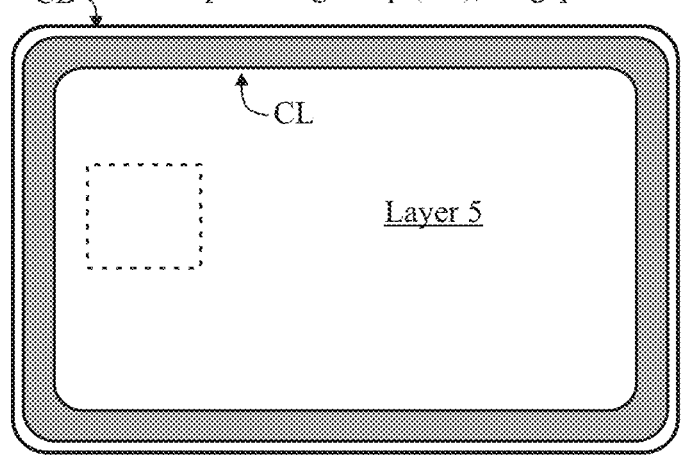
FIG. 4B is diagram of a layer with a compensation loop, without a gap.

FIG. 4A shows that a conductive "compensation loop" CL may be disposed (such as in Layer 5, FIG. 2) behind the booster antenna BA (Layer 3), extending around the periphery of the card body CB. The compensation loop CL may be an open loop having two free ends, and a gap ("gap") therebetween. The compensation loop CL may be made of copper cladding, can be printed on a support layer, etc FIG. 4B shows that the compensation loop CL may comprise ferrite material, in which case since ferrite is not an electrical conductor (in contrast with copper) the loop may be closed, having no gap and no free ends.

The compensation loop may be referred to as a "frame". The compensation frame on the reverse side of the booster antenna BA (FIG. 1) may help with the stabilization of the resonance frequency.

The compensation loop CL may be used in addition to the booster antenna BA. The booster antenna BA may be embedded into one side of an inlay substrate while the compensation frame may be inkjet printed or adhesively attached to the opposite side of the inlay substrate. The compensation loop CL can be mounted using a subtractive (etching away of material) or additive (depositing material) process.

Ferrite

Ferrite layers may be laminated together, and in combination with a copper compensating loop CL on the reverse side of a booster antenna BA may stabilize the resonance frequency of the booster antenna BA. The track may be broken (have a gap) at some position.

Lamination and temperature may be used to sinter ferrite particles together to be a continuous path. Laminating ferrite particles under temperature and very high pressure to produce a thin card material film such as PC PVC PETG to produce a ferrite inlay with antenna. The inlay may consist of several layers of ferrite. The applied temperature and pressure may cause the particles to sinter and form an insulating layer of ferrite.

Depositing ferrite nanoparticles or powder onto an inlay substrate to bend the magnetic flux lines and to compensate for the effect of shielding caused by metallization of the printed layer(s) in a smart card body or any metal layer in close proximity to an RFID antenna in card body; and forming a pre-laminated inlay with a booster antenna or transponder with one or several underlying layers of ferrite which have been laminated together with the RFID components to form a composite inlay layer Ferrite nanoparticles or powder can be applied to a substrate layer by means of wet or dry spraying. In the case of wet spraying the ferrite is suspended in a liquid phase dispersion which is prepared through sonication of the particles in a solvent or aqueous/surfactant liquid. The particles may also have a steric wrap to support the suspension of the particles in the liquid. The mean crystal particle size of the ferrite spheres can be determined by filtering and by the degree of sonication over time. (Sonication is the act of applying sound, usually ultrasound energy to agitate particles in a sample.)

The sintering of the nano-sized ferrite particles occurs during hot lamination of the synthetic layers which make up the inlay. The lamination process includes heating and cooling under high pressure. Several layers of ferrite coated substrates or foils can be used to enhance the ferromagnetic properties. Unlike bulk ferrite granules, nanoparticles have a much lower sintering temperature, matching the glass transition temperature of the synthetic substrate. Additional heat treatment after lamination may be required.

Additional Features Incorporated into the Card Body

As mentioned above, various additional features may be incorporated in various combinations into a body of a smart card (whether metallic or of non-metallic (typical) variety) to enhance electromagnetic coupling of the module antenna, via the booster antenna, with an external contactless reader, thereby increasing activation and read distances to an "acceptable" level. These enhancements may served largely to offset negative effects created by other components of the smart card, such as the metal face plate (202, 302), discussed at length above, or the metal contact pads (CP) on the antenna module (AM), which may also be modified to enhance coupling as discussed in some detail hereinbelow. Some of the card-related features may include disposing ferrite at strategic locations in the card body (CB), such as disclosed in FIGS. 1B, 4I,J of US 20120074233; and various configurations for the booster antenna (BA), several variations of which have been mentioned above.

Laser Etching, and Modifications to the Antenna Module

Mention may be made, very briefly, to using laser etching instead of chemical etching to remove material such as metal from layers such as for forming the module antenna MA of the antenna module AM. A fuller description of this process may be found in 61/589,434 filed Jan. 23, 2012, 61/619,951 filed Apr. 4, 2012 and 61/693,262 filed Aug. 25, 2012.

Chemically etching antennas with 10 to 12 turns within the confinement dimensions of an ISO standard chip card module is described in patent application US 2010/0176205. Such an antenna module with a contact and contactless interface is implanted in a card body for inductive coupling with a booster antenna to communicate with a reader in contactless mode.

Because of the restrictions on the size of the smart card module (e.g. 13 mm×11.8 mm), the number of turns forming the antenna is limited to the space surrounding the central position of the silicon die which is attached and bonded to the module substrate. This substrate is generally made of epoxy glass with a contact metallization layer on the face-up side and a bonding metallization layer on the face-down side of the module. The chemically etched antenna is usually formed on the face-down side.

Another limitation in creating an inductive antenna through chemical etching is the minimum pitch (or spacing) between tracks, which is economically attainable using a lithographic process. The optimal pitch (or spacing) between (adjacent) tracks of an etched antenna on super 35 mm tape is approximately 100 µm. (As used herein, the term "pitch" may refer to the spacing between adjacent conductive tracks, rather than its conventional meaning the center-to-center dimension between track centerlines or the number of tracks per unit length.)

An antenna structure such as a module antenna may be formed by laser etching a copper cladded laminate forming an integral part of an RFID smart card chip module. The use of laser etching may resolve the limiting pitch factor which can be achieved using conventional chemical etching, with the result that the number of turns which form the antenna can be greatly increased, with resulting performance benefits. Using laser versus chemical etching may also result in a significant reduction in the foot-print of the laser-etched antenna having substantially the same electrical characteristics as a chemically-etched antenna requiring a larger area, and allowing for easy placement and adhesion of the antenna chip module in a recess provided in a card body, using standard adhesive tapes.

The material being laser etched may comprise, a standard pre-preg laminate (110 µm) made of epoxy glass and cured halogen free epoxy resin with both sides cladded with copper foil (17 µm+17 µm) may be used to produce contactless and dual interface smart card modules in rows and columns on super 35 mm chip carrier tape. The carrier tape may be provided with sprockets and index holes for transport and punching of holes for vertical interconnects to electrically connect the top and bottom metallization layers can be implemented before laser processing.

The antenna structure at each module site is laser etched (isolation technique) into the copper cladded "seed" layer (face-down side of the pre-preg) having a thickness of 17 µm, using a UV or Green nanosecond or picosecond laser with a distance between tracks dimensionally equal to the width of the laser beam, approximately 25 µm. On the face-up side, the contact areas can also be laser etched in preparation for electroless-plating of copper and electro-plating of nickel and gold. After the laser etching of the copper seed layer, the tape with antenna sites on the face-down side is further processed: sand blasting to remove residual laser ablated particles and to prepare for plating adhesion; depositing carbon to support the through-hole plating of the vertical interconnects; dry film application and photo-masking process; electroless deposition copper (Cu~6 µm) to increase the thickness of the tracks on both sides of the tape, electro-plating of nickel and nickel phosphorous (Ni/NiP~9 µm) or nickel (Ni~9 µm) and palladium/gold or gold (Pd/Au or Au–0.1 µm/0.03 µm or 0.2 µm) to prevent oxidization.

By using a standard pre-impregnated laminate with a seed layer of copper on both sides, it is possible to laser etch contact pads on the face-up side and an antenna structure on the face-down side, before the tape is electroless-plated with copper, and electroplated with nickel and gold. The primary advantages of this technique are the reduction in the feature pitch size (spacing) between tracks and the consequent increase in permissible number of turns within the confinement area of a standard smart card chip module.

Modifying the Contact Pads (CP)

The aforementioned 61/693,262 filed Aug. 25, 2012 discloses various ways (refer to FIGS. 2A-D, 3A-B, 4A-B, 5A-B therein) modifying the contact pads (CP) of a dual interface (DI) antenna module (AM) to offset attenuation of electromagnetic coupling which may be caused by the metallic contact pads (CP). In one example shown therein (FIG. 3A), at least some of the contact pads (CP) may be perforated, such as with holes or slots to reduce what is referred to as "coverage" of the coupling coil CC, to achieve a positive effect on (increase) read distance. The perforations in the contact pads (CP) serve a similar purpose as the openings 324 in the face plate 302. Both features (perforated contact pads, perforated face plate) may be implemented.

As used herein, the term "coverage area" (or "coverage") refers to how much the contact pads (CP), which are on the opposite side of the module tape from the module antenna (MA), overlap the module antenna (MA). Coverage area may be between 0% (no overlap, such as when the MA is situated entirely outside of the perimeter of the CP), and nearly 100% (substantially total overlap, such as when the module MA is situated entirely within the perimeter of the contact pads (CP), but gaps between the pads reduces the number to slightly below 100%). Related thereto, the term "coil exposure" refers to how much of the module antenna (A) which is situated within the area of the contact pads (CP) is exposed, such as through gaps between the contact pads. Coil exposure may be between nearly 0% (the only exposure is through the gaps between the pads) to 100% (such as when the module antenna MA is situated entirely outside of the perimeter of the contact pads).

Figure 5:
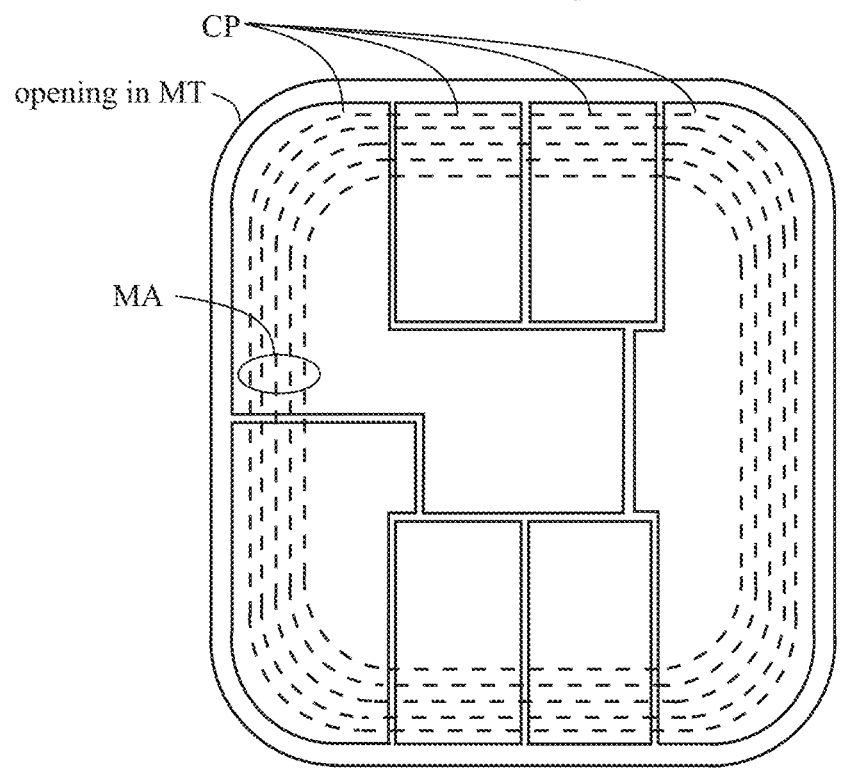
FIG. 5 is a plan view of a typical arrangement of contact pads (CP) on a module tape (MT).

FIG. 5 (comparable to FIG. 1A of 61/693,262) illustrates a typical layout for contact pads (CP) on the face-up side of a module tape (MT). The contact pads (CP) may comprise a layer of conductive material such as copper (typically with other conductive layers for protection) which is etched, either chemically or with a laser (ablation) to exhibit the desired pattern of pads. The overall dimensions of the antenna module (AM) may be approximately 15 mm×15 mm. The overall dimensions of the card body (CB) may be approximately 50 mm×80 mm. The overall dimensions and pattern of the contact pads (CP) may be specified by ISO 7816. For example, the pattern contact pads (CP) may occupy an area measuring approximately 10 mm×13 mm on the face-up side of the module tape (MT), and may have a thickness of approximately 30 µm. FIG. 5 shows seven contact pads (CP), exposed through an opening in the module tape MT.

In FIG. 5, the module antenna (MA) disposed on an opposite side of the module tape MT from the contact pads (CP) is shown in dashed lines. In this example, the coverage area is substantially 100% (the module antenna MA is entirely covered by contact pads (CP), except for the small gaps between adjacent pads), and the coil exposure is substantially 0% (there is only minimal coil exposure in the small gaps between adjacent pads). Therefore, the contact pads CP may shield (attenuate) signals between the booster antenna BA (or card antenna CA) and the module antenna (MA) in the antenna module (AM).

U.S. Pat. No. 8,100,337 (2012, SPS) discloses an electronic module (11) with double communication interface, in particular for a chip card, the said module comprising firstly a substrate (27) provided with an electrical contact terminal block (17) allowing functioning by contact with the contacts of a reader, and secondly comprising an antenna comprising at least one turn (13) and whose terminals are connected to the terminals of a microelectronic chip situated on one face of the module (11). This module (11) is characterized in that the antenna turns (13) are situated substantially outside the area covered by the electrical contacts (17), so that the electrical contacts of the terminal block do not constitute electromagnetic shielding for the signals intended for the antenna. This applies in particular to the production of chip cards with double communication interface with contact and without contact.

Claim 1. An electronic module with double communication interface, for a chip card, said module comprising:
a substrate including an electrical contact terminal block allowing functioning by contact with the contacts of a reader; and
an antenna including at least one turn upon a surface of the electronic module and whose terminals are connected to the terminals of a microelectronic chip situated on one face of the module,
wherein the at least one turn of the antenna is situated upon a first area of the surface of the electronic module substantially outside a second area covered by the electrical contacts, said module having a plurality of protuberances situated outside the area of electrical contacts of the terminal block, on a face of the substrate opposite to that which carries the antenna turns.

As noted in U.S. Pat. No. 8,100,337, and using language more consistent with the present and copending applications of the applicant, when the antenna module (AM) is communicating in a contactless mode with an external reader, the contact pads (CP) may cause "shielding" (or attenuation) of the signal, thereby limiting the read distance. Although having a limited read distance, such as only a few centimeters, may be desirable for security reasons, such shielding may limit the read distance to an uncomfortably small amount, such as 3 cm. More advantageously, a read distance of 5 cm may be desirable, providing adequate security and improved communication between the external reader and the antenna module (AM), including with a smart card (SC) which incorporates the antenna module (AM).

U.S. Pat. No. 6,778,384 (2002, Toppan) shows examples of antenna modules having a module antenna (8) and contact pads (7) where:
- the coverage area is substantially 100%
- the coil exposure is substantially 0%

U.S. Pat. No. 8,100,337 (2012, SPS) shows examples of antenna modules having a module antenna (13) and contact pads (17) where:
- the coverage area is substantially 0%
- the coil exposure is substantially 100%

U.S. Pat. No. 8,100,337 discloses problems may arise when the antenna is situated entirely outside the area of the contacts, and a solution is proposed as follows . . . .

As the turns 13 of the antenna are situated outside the area of the contacts 17, there is no direct pressing action in the area situated above the turns 13 of the antenna and consequently there is potentially a risk of flexion of the substrate 27, or at least of a less good quality bonding between the turns 13 and the adhesive 31, which would impair the liability of the bonding and the longevity of the card. To remedy this risk, the invention provides, in an even more advantageous variant, a plurality of protuberances 33 situated on the same side as the electrical contacts 17 but in the area which overhangs the antenna turns 13. (column 5, lines 7-18)

Addressing the Shielding Problem

The techniques disclosed in each of the following embodiments (examples) may be mixed with one another, as may be appropriate, to arrive at an effective solution. The overall objective is to increase read distance, which may (or may not) result from decreasing the "coverage area" and increasing the "coil exposure".

Figure 6A:
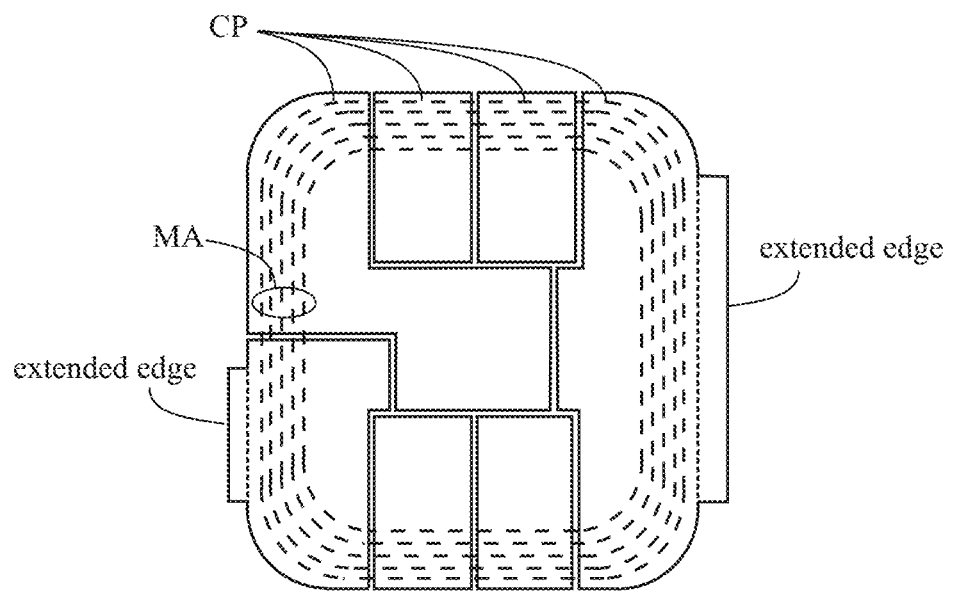
FIG. 6A is a plan view illustrating extending outer edges of contact pads (CP).

FIG. 6A (comparable to FIG. 2A of 61/693,262) illustrates a set of contact pads CP wherein the outer edges of at least some of the contact pads CP are extended beyond their original perimeter (outer edges, shown in dashed lines). The coil coverage in this example may be characterized as having been increased, such as from an initial 100% to more than 100%, such as 110%. The coil exposure in this example remains substantially 0%. It is believed that extending the edges may have an adverse effect on (reduce) read distance.

Extending the edges to increase the area of individual pad may be useful when using the pads as interconnects for elements such as the module antenna MA on the underside of the module tape MT, capacitive elements and the like.

Figure 5A:
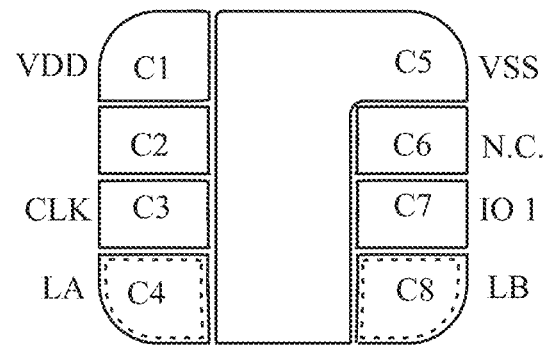
FIG. 5A is a diagram showing an exemplary contact pad layout and assignments.

Consider, for example, the following contact pad layout/assignments shown in FIG. 5A. Note that contacts C4 and C8 may be connected with the two ends (LA, LB) of the module antenna MA.

Figure 6B:
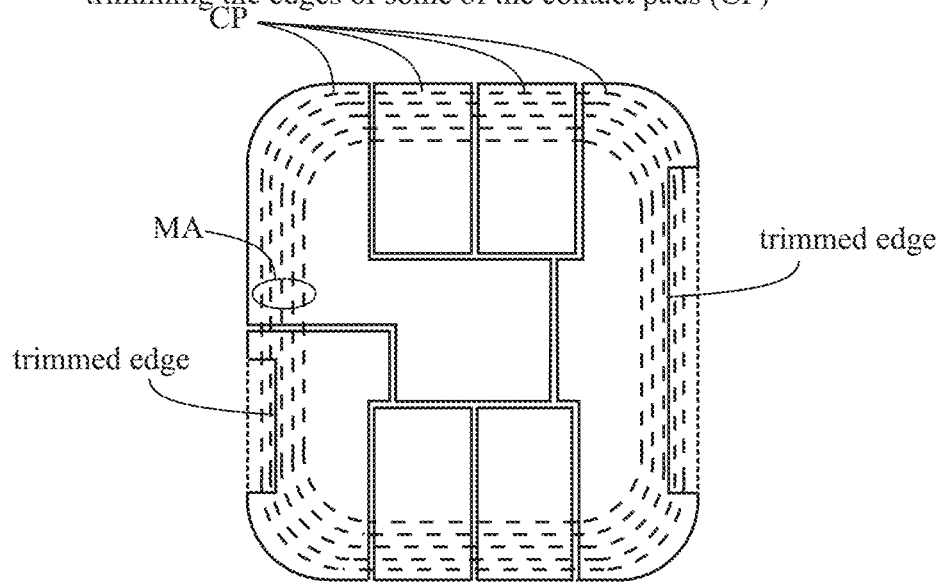
FIG. 6B is a plan view illustrating trimming outer edges of contact pads (CP).

FIG. 6B (comparable to FIG. 2B of 61/693,262) illustrates a set of contact pads CP wherein the outer edges of at least some of the contact pads CP are trimmed to be within their original perimeter (outer edges, shown in dashed lines). The coil coverage in this example is decreased, such as from an initial 100% to 90%. The coil exposure in this example is increased, such as from initially substantially 0% to 5% It is believed that trimming the edges may have a slight positive effect on (increase) read distance.

Figure 6C:
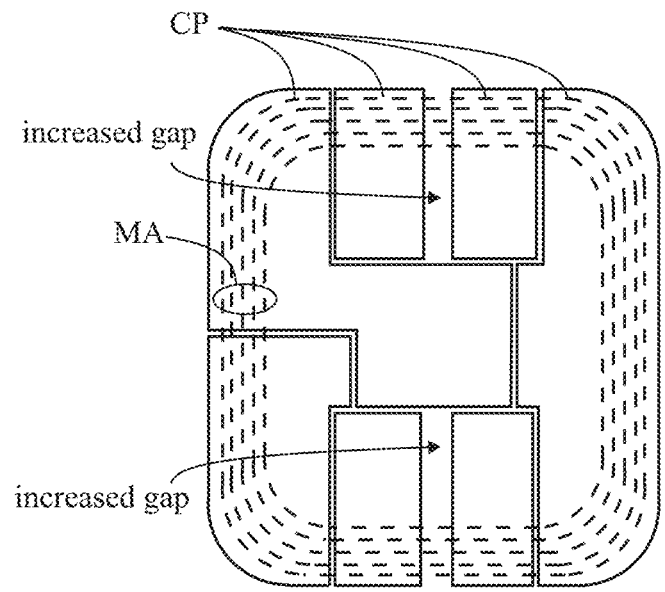
FIG. 6C is a plan view illustrating increasing the gap between contact pads (CP).

FIG. 6C (comparable to FIG. 2C of 61/693,262) illustrates a set of contact pads CP wherein the inner edges of at least some adjacent ones of the contact pads CP are trimmed, so as to have the effect of increasing the gap between the selected ones of the contact pads, The coil coverage in this example is decreased, such as from an initial 100% to 90%. The coil exposure in this example is increased, such as from initially substantially 0% to 5% It is believed that increasing the gap may have a slight positive effect on (increase) read distance.

original gap=~150 μm
modified gap=~300 μm

Figure 6D:
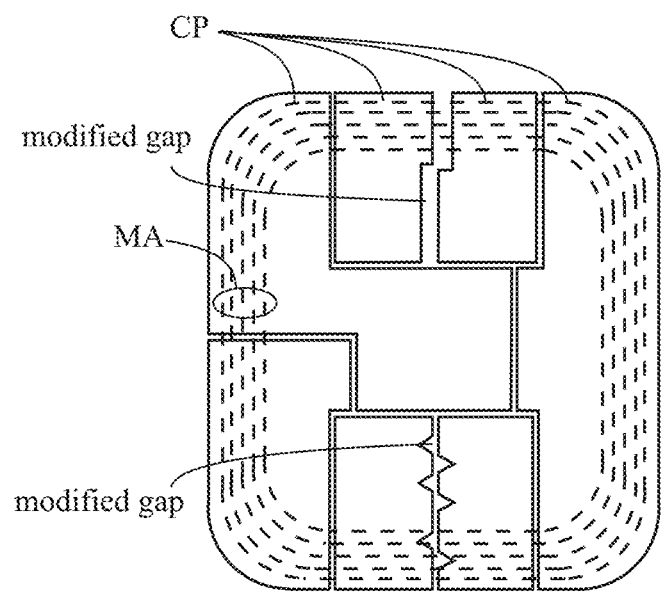
FIG. 6D is a plan view illustrating modifying the gap between contact pads (CP).

FIG. 6D (comparable to FIG. 2D of 61/693,262) illustrates an alternative to FIG. 6C, wherein rather than increasing the entire gap between adjacent contact pads, their inner edges are modified in an irregular manner. The coil coverage in this example is decreased, such as from an initial 100% to 95%. The coil exposure in this example is increased, such as from initially substantially 0% to 3% It is believed that increasing the gap may have a slight positive effect on (increase) read distance.

In the preceding examples set forth in FIGS. 6A,B,C,D above, some outer or inner edges of some of the contact pads are shifted from their "original" position(s). Compare FIG. 5 as being an example of "original position".

Figure 7A:
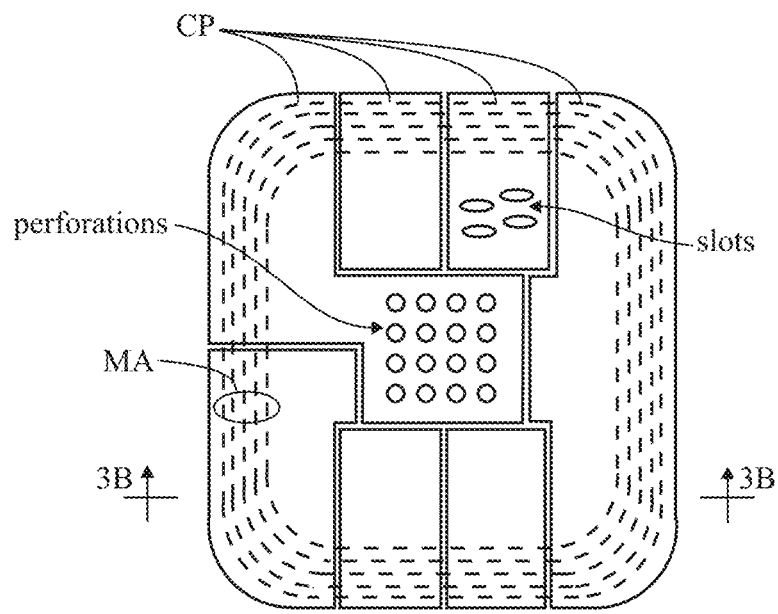
FIG. 7A is a plan view illustrating perforating the contact pads (CP).

In the examples that follow, the edges of the contact pads generally remain intact, in their original position, thereby substantially maintaining the central design FIG. 7A (comparable to FIG. 3A of 61/693,262) shows an example of perforating, such as with holes or slots, at least some of the contact pads. The coil coverage in this example is decreased, such as from an initial 100% to 90%. The coil exposure in this example is increased, such as from initially substantially 0% to 5% It is believed that perforating the contact pads may have a positive effect on (increase) read distance.

In FIG. 7A, a regular array of a plurality of circular perforations (or holes) arranged in an array of rows and columns is shown in one of the contact pads. The perforations may be arranged irregularly, staggered, interleaved, quasi-randomly, and the like. The circular perforations may have an exemplary diameter of 35 μm, and be arranged at an exemplary pitch of 70 μm or 140 μm, or 40 μm (offset rows of 35 μm holes). Some of the perforations may be slots, or elongated holes, as shown in another of the contact pads. Holes having other shapes such as rectangular, irregular, elongated, etc, may be formed in some of the contact pads.

Figure 7B:
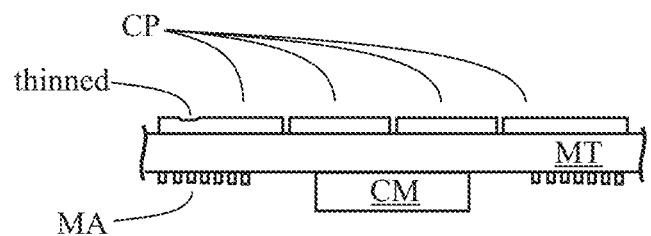
FIG. 7B is a cross-sectional view illustrating thinning the contact pads (CP).

FIG. 7B (comparable to FIG. 3B of 61/693,262) shows an example of thinning selected areas of at least some of the contact pads. The coil coverage in this example is "effectively" decreased, such as from an initial 100% to 95%. The coil exposure in this example is "effectively" increased, such as from initially substantially 0% to 2% It is believed that thinning the contact pads may have a positive effect on (increase) read distance.

In FIG. 7B, the module antenna MA is shown as being an etched, having conductive lines (tracks), rather than the coiled wire module antenna MA shown in FIG. 1.

Figure 8A:
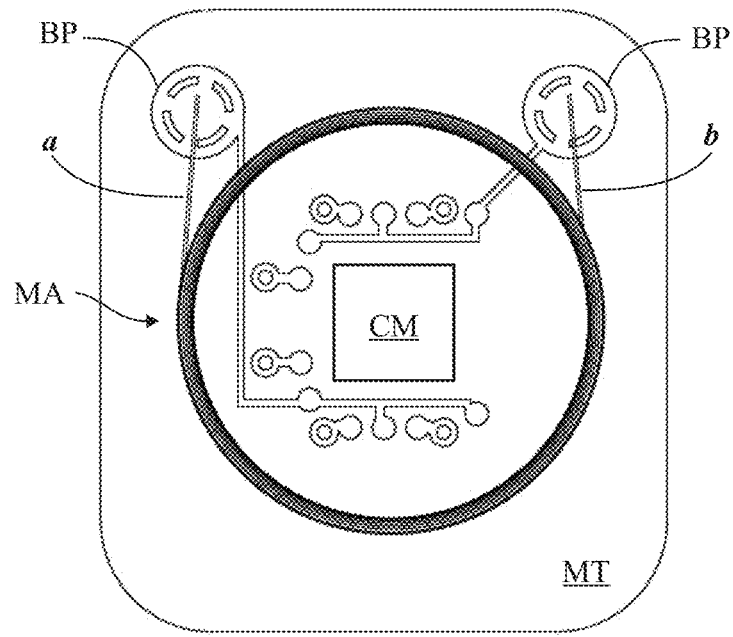
FIG. 8A is a plan view illustrating the underside of a module tape (MT).

FIG. 8A (comparable to FIG. 4A of 61/693,262) shows a module antenna MA and chip CM disposed on the underside of a module tape MT. In this example, the module antenna MA is a wound coil of wire, having two ends a, b bonded to respective bond pads BP.

Figure 8B:
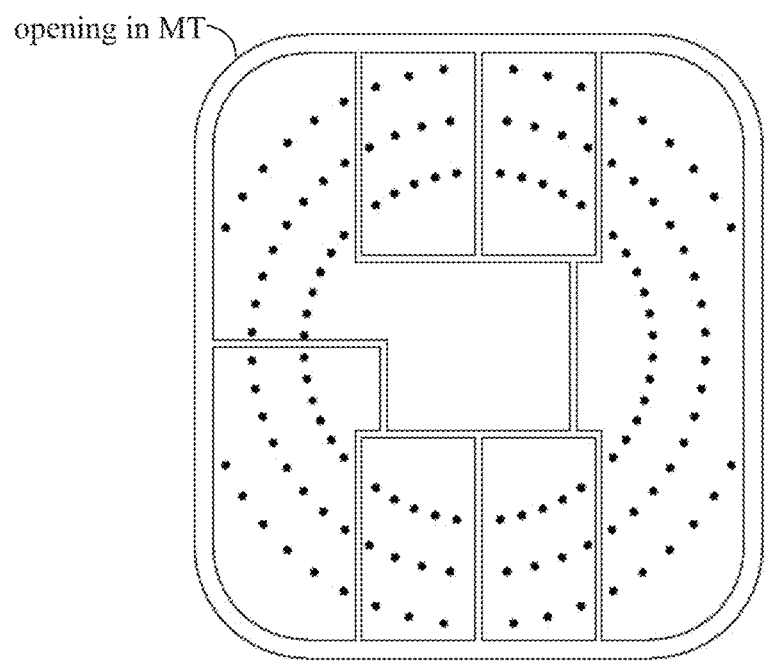
FIG. 8B is a plan view illustrating perforating the contact pads (CP).

FIG. 8B (comparable to FIG. 4B of 61/693,262) shows the face-up side of the module tape MT shown in FIG. 8A. Here, a pattern of holes or perforations is formed in the contact pads CP (compare FIG. 3A). The pattern of perforations is arranged in concentric circles. This pattern will be visible to the user (of the smart card SC). The coil coverage in this example is "effectively" decreased, such as from an initial 100% to 95%. The coil exposure in this example is "effectively" increased, such as from initially substantially 0% to 2% It is believed that perforating the contact pads in this manner may have a positive effect on (increase) read distance.

Figure 9A:
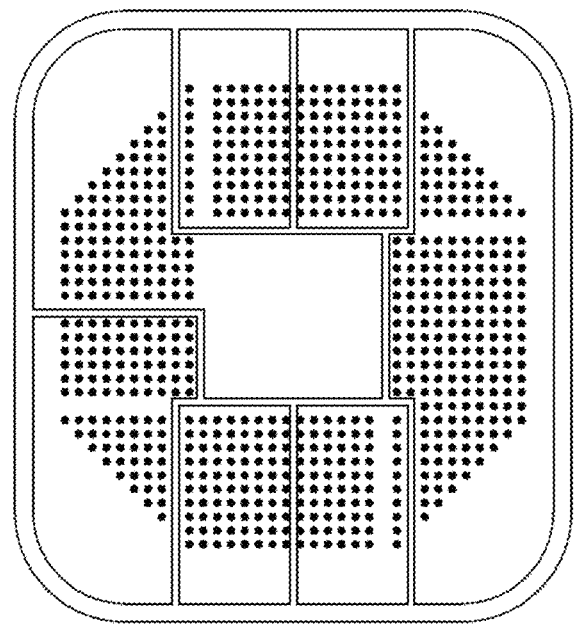
FIG. 9A is a plan view illustrating perforating the contact pads (CP).

FIG. 9A (comparable to FIG. 5A of 61/693,262) shows another example of perforating the contact pads CP. In this example, the perforations are visible, and are arranged in the pattern of a logo, such as the logo for Chase Bank.

Figure 9B:
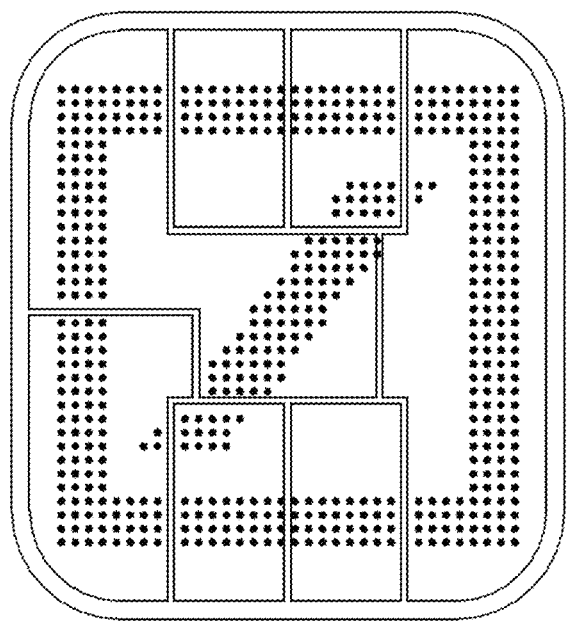
FIG. 9B is a plan view illustrating perforating the contact pads (CP).

FIG. 9B (comparable to FIG. 5B of 61/693,262) shows another example of perforating the contact pads CP. In this example, the perforations are visible, and are arranged in the pattern of a logo, such as the logo for Deutsche Bank.

The patterns of perforations in the contact pads may be visible to the user, and in metallized cards can be formed to mimic or complement (such as being smaller versions of, or continuations of, of the like) the perforations 324 surrounding the window opening 320 in the face plate 302.

In the examples set forth hereinabove, the contact pads CP of an antenna module AM have been modified with the goal of increasing read distance (by reducing attenuation in coupling between the module antenna MA and the booster antenna BA which may be attributable to the contact pads CP). In some cases, the coil coverage (or effective coil coverage) is decreased, and the coil exposure (or effective coil exposure) is increased. In some examples, the contact pads, including inner and outer edges thereof, maintain their original position. In some examples, the central design of the contact pads is maintained. Larger gaps between contact pads and perforations in the contact pads CP resulting in more coil exposure may improves read distance.

Some Other Aspects of the Antenna Module AM

Figure 10A:
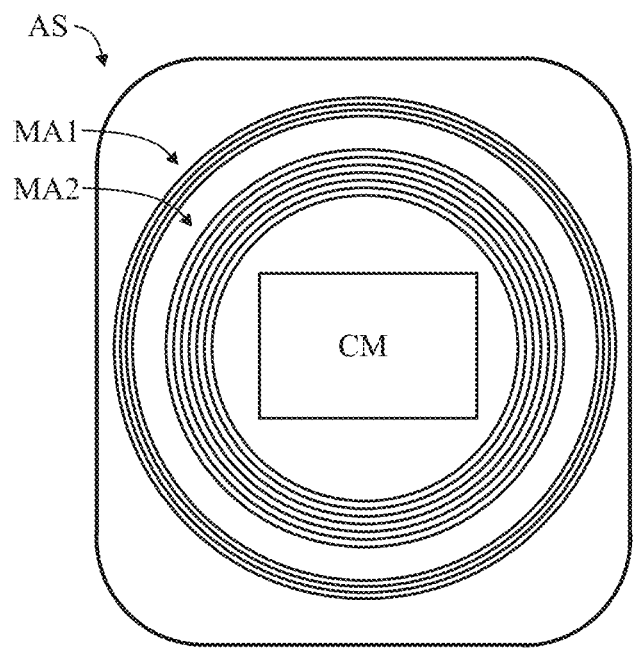
FIG. 10A is plan view of the underside of an (AM), having two antenna segments.

FIG. 10A (comparable to FIG. 6A of 61/693,262) illustrates the underside of a module tape MT. Two module antenna segments MA1 and MA2 are shown. These two module antenna segments MA1, MA2 may be arranged concentric with one another, as inner and outer antenna structures. Both module antenna segments MA1, MA2 may be wound coils, or patterned tracks, or one may be a wound coil and the other a pattern of tracks. The two module antenna segments MA1, MA2 may be interconnected with one another in any suitable manner to achieve an effective result. For example, the two module antenna segments MA1, MA2 may be connected in any suitable manner with one another.

Figure 10B:
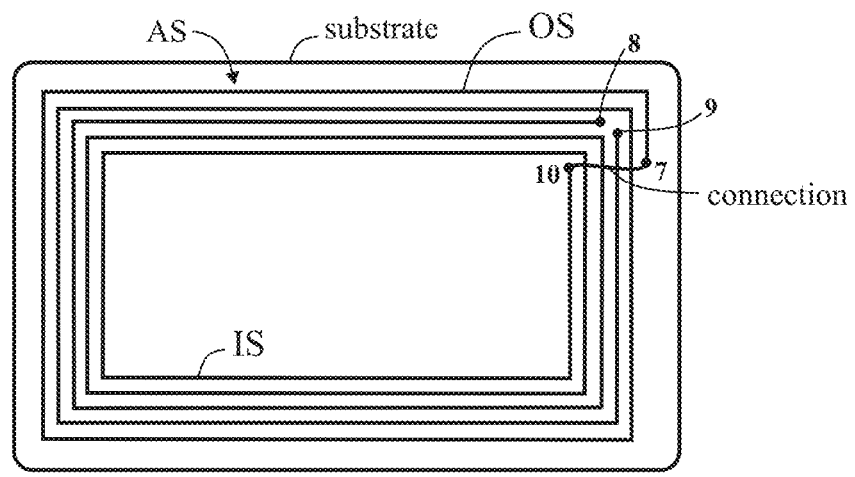
FIG. 10B is a diagrammatic view of an antenna structure (AS).

FIG. 10B (comparable to FIG. 5A of 61/693,262) illustrates an exemplary antenna structure AS which may be used in an antenna module AM, having two segments (compare MA1, MA2) which are interconnected with one another, the antenna structure comprising an outer segment OS having an outer end 7 and an inner end 8 an inner segment IS having an outer end 9 and an inner end 10 the outer end 7 of the outer segment OS is connected with the inner end 10 of the inner segment IS the inner end 8 of the outer segment OS and the outer end 9 of the inner segment IS are left unconnected this forms what may be referred to as a "quasi dipole" antenna structure AS. Compare FIG. 1A.

Such an arrangement is shown in Ser. No. 13/205,600 filed Aug. 8, 2011 (pub 2012/0038445, Feb. 16, 2012) for use as a booster antenna BA in the card body CB of a smart card SC Such an arrangement is shown in Ser. No. 13/310,718 filed Dec. 3, 2011 (pub 2012/0074233, Mar. 29, 2012) for use as a booster antenna BA in the card body CB of a smart card SC The contact pads CP and antenna structures AS described herein may be formed using laser etching (isolation technique) of copper cladded "seed" layers on a module tape MT using a UV nanosecond or picosecond laser. A seed layer may have a thickness of approximately 17 µm. For the antenna structures AS, the space between tracks may be dimensionally equal to the width of the laser beam, approximately 30 µm. the tracks themselves may have a width of 30-50 µm. Perforations, such as those described above, may be formed by laser percussion drilling.

After laser etching of the copper seed layer to pattern and/or to perforate the contact pads CP or antenna structure (s) AS, the module tape MT may be further processed as follows:

sand blasting to remove residual laser ablated particles and to prepare for plating adhesion;

depositing carbon to support the through-hole plating of the vertical interconnects;

dry film application and photo-masking process;

electrodepositing copper (Cu~6 µm) to increase the thickness of the patterned (for CP or AS) seed layer on both sides of the tape;

electroless plating of nickel and nickel phosphorous (Ni/NiP~9 µm) or nickel (Ni~9 µm) and palladium/gold or gold (Pd/Au or Au−0.1 m/0.03 µm or 0.2 µm) to prevent oxidization.

While the invention(s) has/have been described with respect to a limited number of embodiments, these should not be construed as limitations on the scope of the invention (s), but rather as examples of some of the embodiments. Those skilled in the art may envision other possible variations, modifications, and implementations that are also within the scope of the invention(s), based on the disclosure (s) set forth herein.

What is claimed is:

1. A smartcard comprising:
a card body (CB) comprising an inlay substrate having a peripheral area;
a booster antenna (BA) having a peripheral portion (CA) disposed in the peripheral area on one side of the inlay substrate; and
a compensation loop (CL) disposed in the peripheral area, behind the booster antenna, on an opposite side of the inlay substrate.

2. The smartcard of claim 1, further comprising:
a metallized face plate with a window opening (W) for accepting an antenna module (AM).

3. The smartcard of claim 2, wherein:
the window opening is substantially larger than the antenna module, resulting in a gap between inner edges of the window opening and the antenna module.

4. The smartcard of claim 2, further comprising:
a ferrite layer disposed between the face plate and the booster antenna.

5. The smartcard of claim 2, further comprising:
a plurality of perforations in the face plate extending around at least one of the window opening and the periphery of the face plate.

6. The smartcard of claim 1, wherein:
the compensation loop has a gap, and two free ends.

7. The smartcard of claim 1, wherein:
the compensation loop is formed as a continuous loop, with no free ends.

8. The smartcard of claim 1, wherein:
the compensation loop comprises a conductive material.

9. The smartcard of claim 1, wherein:
the compensation loop comprises ferrite.

10. The smartcard of claim 1, wherein:
the compensation loop is aligned with and approximately the same size as the peripheral portion of the booster antenna.

11. The smartcard of claim 1, further comprising:
an antenna module (AM) having an RFID chip, an antenna (MA), and contact pads (CP).

12. The smartcard of claim 11, wherein:
the booster antenna includes a coupler coil (CC).

13. The smartcard of claim 12, wherein:
the coupler coil is offset from the module antenna.

14. The smartcard of claim 11, further comprising:
a ferrite element disposed between the module antenna and contact pads.

15. The smartcard of claim 11, further comprising:
perforations in the contact pads.

16. The smartcard of claim 1, further comprising:
ferrite material disposed between the face plate and the booster antenna.

* * * * *